United States Patent
Kawasaki et al.

(10) Patent No.: US 11,840,754 B2
(45) Date of Patent: Dec. 12, 2023

(54) VAPOR DEPOSITION MASK, METHOD FOR PRODUCING ORGANIC SEMICONDUCTOR ELEMENT, AND METHOD FOR PRODUCING ORGANIC EL DISPLAY

(71) Applicant: Dai Nippon Printing Co., Ltd., Tokyo (JP)

(72) Inventors: Hiroshi Kawasaki, Tokyo (JP); Yasuko Sone, Tokyo (JP); Kumiko Hokari, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 833 days.

(21) Appl. No.: 16/307,286

(22) PCT Filed: Jun. 27, 2017

(86) PCT No.: PCT/JP2017/023484
§ 371 (c)(1),
(2) Date: Dec. 5, 2018

(87) PCT Pub. No.: WO2018/003766
PCT Pub. Date: Jan. 4, 2018

(65) Prior Publication Data
US 2019/0136365 A1    May 9, 2019

(30) Foreign Application Priority Data

Jun. 28, 2016  (JP) .................................. 2016-127522
Jun. 26, 2017  (JP) .................................. 2017-124079

(51) Int. Cl.
*C23C 14/04*    (2006.01)
*H05B 33/10*    (2006.01)
(Continued)

(52) U.S. Cl.
CPC .......... *C23C 14/042* (2013.01); *C23C 16/045* (2013.01); *H05B 33/10* (2013.01);
(Continued)

(58) Field of Classification Search
CPC ... C23C 14/042; C23C 16/045; C23C 16/042; C23C 8/04; C23C 10/04; C23C 14/04;
(Continued)

(56) References Cited

U.S. PATENT DOCUMENTS

2005/0115503 A1    6/2005  Hagiwara et al.
2012/0060756 A1*   3/2012  Ookawara ............. C23C 14/042
                                                       118/504
(Continued)

FOREIGN PATENT DOCUMENTS

CN    203728917    *  7/2014  ............. C23C 14/04
CN    203728917 U     7/2014
(Continued)

OTHER PUBLICATIONS

International Search Report and Written Opinion (Application No. PCT/JP2017/023484) dated Sep. 5, 2017.
(Continued)

*Primary Examiner* — Aiden Lee
(74) *Attorney, Agent, or Firm* — BURR PATENT LAW, PLLC

(57) ABSTRACT

There is provided a vapor deposition mask including: a resin mask including a plurality of resin mask openings corresponding to a pattern to be produced by vapor deposition; and a metal mask including a metal mask opening, the resin mask and the metal mask being stacked such that the resin mask openings overlap with the metal mask opening, wherein a shape of the metal mask opening as the metal mask is seen in plan view includes a polygon as a basic shape and an elongation part, added to the polygon, the
(Continued)

elongation part elongating a length of a whole periphery of the polygon.

5 Claims, 17 Drawing Sheets

(51) Int. Cl.
    *C23C 16/04*     (2006.01)
    *H10K 50/11*     (2023.01)
    *H10K 71/16*     (2023.01)

(52) U.S. Cl.
    CPC ............ *H10K 50/11* (2023.02); *C23C 16/042* (2013.01); *H10K 71/166* (2023.02)

(58) Field of Classification Search
    CPC ....... C23C 14/044; C23C 16/04; C23C 18/06; H05B 33/10; H01L 51/5012; H01L 51/0011; H10K 71/166; C30B 25/04
    See application file for complete search history.

(56) References Cited

U.S. PATENT DOCUMENTS

| | | |
|---|---|---|
| 2012/0295379 A1 | 11/2012 | Sonoda et al. |
| 2014/0357001 A1* | 12/2014 | Jun ....................... C23C 14/042 438/34 |
| 2015/0007768 A1* | 1/2015 | Lee ....................... B05C 21/005 118/504 |
| 2015/0037928 A1 | 2/2015 | Hirobe et al. |
| 2016/0047030 A1 | 2/2016 | Obata et al. |
| 2016/0168691 A1* | 6/2016 | Takeda ................. B23K 26/082 118/504 |
| 2016/0343945 A1* | 11/2016 | Kim ....................... C23C 14/042 |
| 2018/0171470 A1 | 6/2018 | Takeda et al. |

FOREIGN PATENT DOCUMENTS

| | | |
|---|---|---|
| CN | 105143497 A | 12/2015 |
| JP | 2004-149868 A1 | 5/2004 |
| JP | 2005-163111 A1 | 6/2005 |
| JP | 2008-208460 A1 | 9/2008 |
| JP | 5288072 B2 | 9/2013 |
| JP | 2014-194062 A1 | 10/2014 |
| JP | 2014-208899 A1 | 11/2014 |
| KR | 10-2012-0094112 A | 8/2012 |

OTHER PUBLICATIONS

Chinese Office Action (Application No. 201780037694.8) dated Jul. 24, 2020.
Korean Office Action (Application No. 10-2018-7035714) dated May 17, 2021 (with English translation).

* cited by examiner

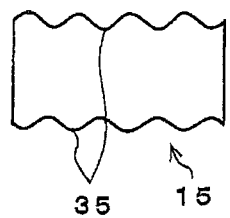
FIG. 4 (a)
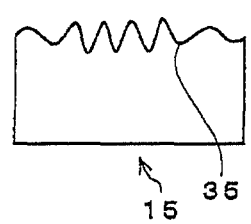
FIG. 4 (b)
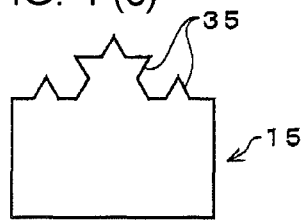
FIG. 4 (c)
FIG. 5 (a)
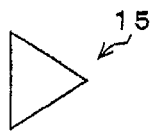
FIG. 5 (b)
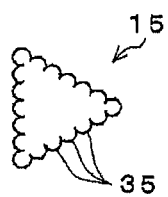
FIG. 5 (c)
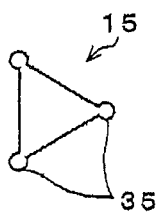
FIG. 5 (d)
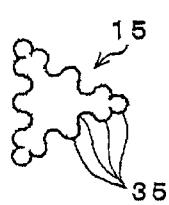
FIG. 5 (e)
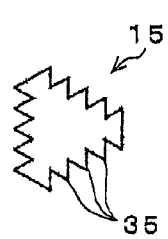
FIG. 5 (f)
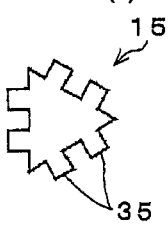
FIG. 5 (g)
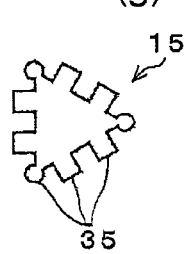

VAPOR DEPOSITION MASK, METHOD FOR PRODUCING ORGANIC SEMICONDUCTOR ELEMENT, AND METHOD FOR PRODUCING ORGANIC EL DISPLAY

TECHNICAL FIELD

Embodiments of the present disclosure relate to a vapor deposition mask, a method for producing an organic semiconductor element, and an organic EL display.

BACKGROUND ART

Formation of a vapor deposition pattern using a vapor deposition mask is typically performed by bringing the vapor deposition mask in which openings corresponding to a pattern to be produced by vapor deposition are provided into close contact with a vapor deposition target, and causing a vapor deposition material released from a vapor deposition source to adhere onto the vapor deposition target through the openings.

As the aforementioned vapor deposition mask used for forming the vapor deposition pattern, for example, there is known a vapor deposition mask including: a resin mask including resin mask openings corresponding to a pattern to be produced by vapor deposition; and a metal mask including a metal mask opening (sometimes referred to as slit), the resin mask and the metal mask being stacked (for example, refer to Patent Document 1).

CITATION LIST

Patent Document

Patent Document 1: Japanese Patent No. 5288072

SUMMARY

Technical Problem

A primary object of an embodiment of the present disclosure is to provide, for a vapor deposition mask in which a resin mask and a metal mask are stacked, a vapor deposition mask capable of forming a vapor deposition pattern with further higher definition, and moreover, to provide a method for forming an organic semiconductor element capable of producing an organic semiconductor element with excellent precision, and further, to provide a method for producing an organic EL display.

Solution to Problem

There is provided a vapor deposition mask according to an embodiment of the present disclosure, including: a resin mask including a plurality of resin mask openings corresponding to a pattern to be produced by vapor deposition; and a metal mask including a metal mask opening, the resin mask and the metal mask being stacked such that the resin mask openings overlap with the metal mask opening, wherein a shape of the metal mask opening as the metal mask is seen in plan view includes a polygon as a basic shape and an elongation part, added to the polygon, the elongation part elongating a length of a whole periphery of the polygon.

In the vapor deposition mask according to an embodiment of the present disclosure, the metal mask may include one or a plurality of rigidity adjustment parts that partially reduce rigidity of the metal mask at a position not overlapping with the resin mask openings of the resin mask.

Moreover, in the vapor deposition mask according to an embodiment of the present disclosure, the rigidity adjustment part may be a through hole penetrating the metal mask or a recess part provided in the metal mask.

Moreover, there is provided a method for producing an organic semiconductor element according to another embodiment of the present disclosure, including a vapor deposition pattern forming step of forming a vapor deposition pattern on a vapor deposition target using a vapor deposition mask, wherein the vapor deposition mask used in the vapor deposition pattern forming step is the aforementioned vapor deposition mask according to an embodiment of the present disclosure.

Moreover, there is provided a method for producing an organic EL display according to another embodiment of the present disclosure, wherein the organic semiconductor element produced by the aforementioned method for producing an organic semiconductor element according to an embodiment of the present disclosure is used.

Advantageous Effects

According to a vapor deposition mask according to the present disclosure, a vapor deposition pattern with high definition can be formed. Moreover, according to the method for producing an organic semiconductor element according to the present disclosure, an organic semiconductor element can be produced with excellent precision. Moreover, according to the method for producing an organic EL display according to the present disclosure, an organic EL display can be produced with excellent precision.

BRIEF DESCRIPTION OF DRAWINGS

FIGS. 4(a)-(c) show elevation views exemplarily showing shapes of the metal mask opening as the vapor deposition mask according to an embodiment of the present disclosure is seen from the metal mask side in plan view.

FIGS. 5(a)-(g) show elevation views exemplarily showing shapes of the metal mask opening as the vapor deposition mask according to another embodiment of the present disclosure is seen from the metal mask side in plan view.

DESCRIPTION OF EMBODIMENTS

Figure 1:
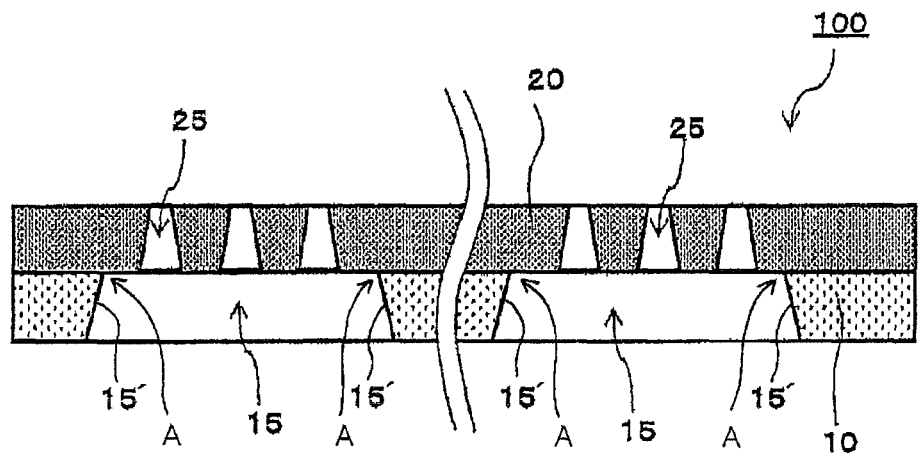
FIG. 1(a) is a schematic cross-sectional view exemplarily showing a vapor deposition mask according to an embodiment of the present disclosure.
FIG. 1(b) is an elevation view exemplarily showing a vapor deposition mask according to an embodiment of the present disclosure as seen from the metal mask side in plan view.
Figure 1:
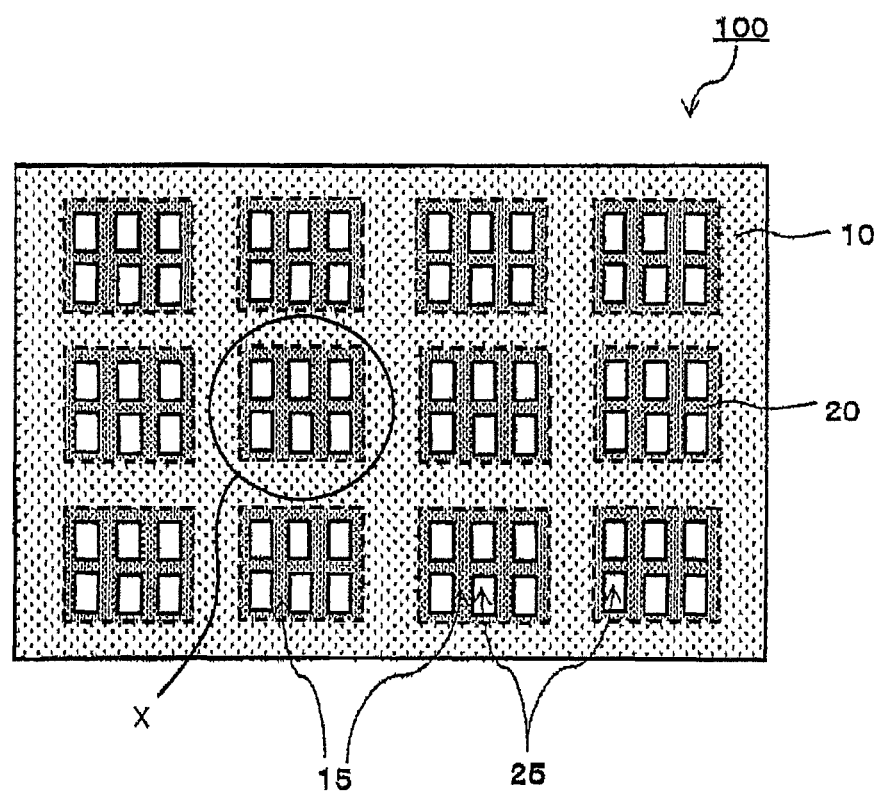

Hereafter, embodiments of the present invention are described with reference to the drawings and the like. Notably, embodiments of the present invention can be implemented in many different modes and should not be construed to be limited to the contents of description of embodiments exemplified below. Moreover, while in the drawings, there are cases where widths, thicknesses, shapes of individual parts are schematically presented as compared with those in actual modes for more clarity of the description, they are merely exemplary, not limiting interpretation of an embodiment of the present invention. Moreover, in the specification of the present application and the drawings, elements similar to those described regarding already shown drawings are sometimes given the same signs to properly omit their detailed description. Moreover, while the description is made using terms such as "upward", "downward" and the like for convenience of the description, the upward and downward directions may be reversed. The same holds true for the rightward and leftward directions.

<<Vapor Deposition Mask>>

As shown in FIGS. 1(a) and 1(b), a vapor deposition mask 100 according to an embodiment of the present disclosure (hereinafter sometimes referred to as vapor deposition mask of the present disclosure) exhibits a configuration including: a resin mask 20 including a plurality of resin mask openings 25 corresponding to a pattern to be produced by vapor deposition; and a metal mask 10 including a metal mask opening 15, the resin mask and the metal mask being stacked such that the resin mask openings 25 overlap with the metal mask opening 15. Notably, FIG. 1(a) is a schematic cross-sectional view exemplarily showing the vapor deposition mask 100 of the present disclosure, FIG. 1(b) is an elevation view of the vapor deposition mask 100 of the present disclosure as seen from the metal mask side in plan view, and in the mode showing in FIG. 1, illustration of elongation parts 35 mentioned later is omitted.

When a vapor deposition pattern is formed onto a vapor deposition target using the vapor deposition mask 100 as above, the vapor deposition mask 100 is typically repeatedly used, and it is cleaned using ultrasonic waves or the like between its use and another use. For example, in the case where ultrasonic cleaning is performed, fine vibration is to be repeatedly applied to the vapor deposition mask 100, and when the metal mask 10 constituting the vapor deposition mask 100 resonates with such fine vibration, a part of the resin mask 20 positioned close to the metal mask opening 15 of the metal mask 10 has occasionally broken. The inventors of this application have been focusing on and investigating this point, and as a result, found that in portions (signs A) where edges 15' of the metal mask openings 15 of the metal mask 10 are in contact with the resin mask 20, there is a high possibility that breakage of the resin mask 20 occurs due to the resonance of the metal mask 10.

Figure 2:
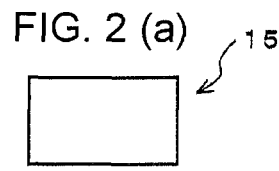
FIGS. 2(a)-(f) show elevation views exemplarily showing shapes of a metal mask opening as the vapor deposition mask according to an embodiment of the present disclosure is seen from the metal mask side in plan view.
Figure 2:
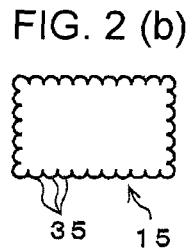
Figure 2:
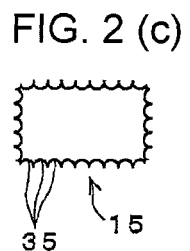
Figure 2:
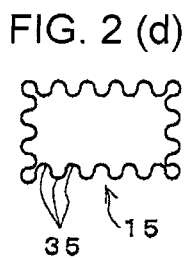
Figure 2:
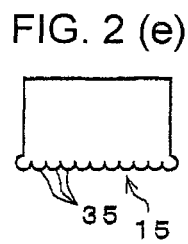
Figure 2:
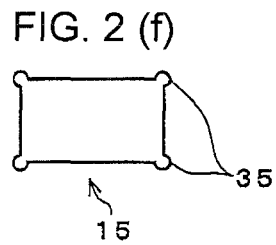
Figure 3:
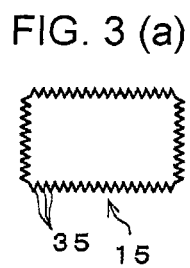
FIGS. 3(a)-(i) show elevation views exemplarily showing shapes of the metal mask opening as the vapor deposition mask according to an embodiment of the present disclosure is seen from the metal mask side in plan view.
Figure 3:
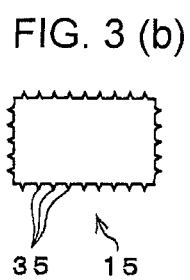
Figure 3:
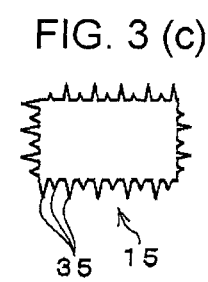
Figure 3:
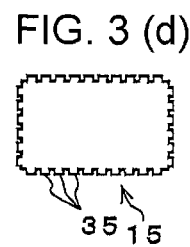
Figure 3:
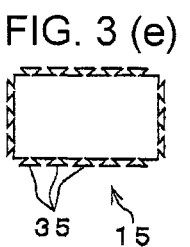
Figure 3:
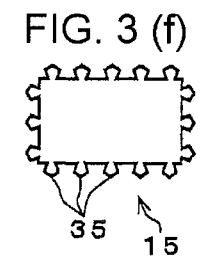
Figure 3:
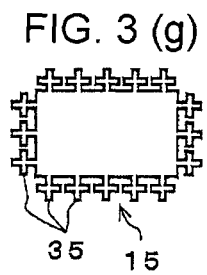
Figure 3:
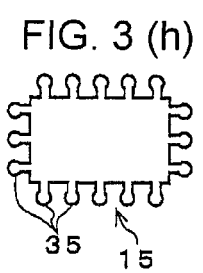
Figure 3:
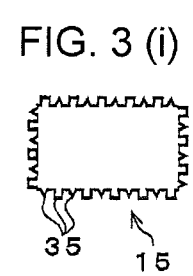

The vapor deposition mask 100 according to an embodiment of the present disclosure is devised based on the aforementioned knowledge, and as shown in FIG. 2 to FIG. 4, the shape of the metal mask opening 15 of the metal mask 10 as the metal mask 10 is seen in plan view includes a polygon as a basic shape (rectangle in FIG. 2 to FIG. 4) and an elongation part 35, added to the polygon, the elongation part 35 elongating a length of a whole periphery of the polygon. According to the vapor deposition mask 100 according to an embodiment of the present disclosure as above, since the elongation part 35 for elongating the length of the whole periphery of the opening is added to the whole periphery thereof, in other words, the portion of the edge thereof which is a portion with a high possibility that the resin mask 20 breaks when the metal mask 10 resonates, by this elongation shifting the resonance frequency of the metal mask 10, stress exerted on the portion can be dispersed, and therefore, a probability that the resin mask 20 breaks can be reduced. Notably, FIG. 2 to FIG. 4 show plan views exemplarily showing shapes of the metal mask opening 15 as the vapor deposition mask 100 according to an embodiment of the present disclosure is seen from the metal mask 10 side in plan view.

Hereafter, individual configurations of the vapor deposition mask 100 of the present disclosure are exemplarily described.

<Resin Mask>

As shown in FIG. 1(b), a plurality of resin mask openings 25 are provided in the resin mask 20. While in the mode shown in the figure, the opening shape of the resin mask opening 25 exhibits a rectangular shape, the opening shape of the resin mask opening 25 is not specially limited but may be any shape as long as it is a shape corresponding to a pattern to be produced by vapor deposition. For example, the opening shape of the resin mask opening 25 may be rhombic or polygonal or may be a shape having a curvature such as a circle and an ellipsoid. Notably, it can be said that the rectangular or polygonal opening shape is a preferable opening shape of the resin mask opening 25 in view of capability of securing a larger area of light emission as compared with the opening shape having a curvature such as a circle and an ellipsoid.

The material of the resin mask 20 is not limited but, for example, a material that enables formation of the resin mask openings 25 with high definition by laser processing or the like, includes a low rate of dimensional change and a low rate of humidity absorption under heat and with passage of time, and is light weight is preferably used. As such materials, a polyimide resin, a polyamide resin, a polyamide-imide resin, a polyester resin, a polyethylene resin, a polyvinyl alcohol resin, a polypropylene resin, a polycarbonate resin, a polystyrene resin, a polyacrylonitrile resin, an ethylene-vinyl acetate copolymer resin, an ethylene-vinyl alcohol copolymer resin, an ethylene-methacrylic acid copolymer resin, a polyvinyl chloride resin, a polyvinylidene chloride resin, cellophane, an ionomer resin and the like can be cited. Among the materials exemplarily cited above, resin materials with the thermal expansion coefficients of about 16 ppm/° C. or less are preferable, resin materials with the rates of humidity absorption of about 1.0% or less are preferable, and resin materials including both conditions are particularly preferable. The resin mask 20 using these resin materials enables dimensional precision of the resin mask openings 25 to be improved and a rate of dimensional change and a rate of humidity absorption under heat and with passage of time to be small.

The thickness of the resin mask 20 is not specially limited but, in the case of further improving the effect of suppressing generation of a shadow, the thickness of the resin mask 20 is preferably not more than about 25 μm, still preferably less than about 10 μm. A preferable range of the lower limit value is not specially limited but, in the case where the thickness of the resin mask 20 is less than about 3 μm, defects such as a pinhole tend to arise and a risk of deformation or the like increases. In particular, by setting the thickness of the resin mask 20 to be not less than about 3 μm and less than about 10 μm, still preferably not less than about 4 μm and not more than about 8 μm, the influence of a shadow in formation of a high definition pattern exceeding 400 ppi can be more effectively prevented. Moreover, while the resin mask 20 may be directly bonded to the metal mask 10 mentioned later or may be bonded thereto via a pressure-sensitive adhesive agent layer, in the case where the resin mask 20 is bonded to the metal mask 10 via the pressure-sensitive adhesive agent layer, the total thickness of the resin mask 20 and the pressure-sensitive adhesive agent layer is preferably within the aforementioned preferable thickness range. Notably, the shadow is a phenomenon that a part of a vapor deposition material released from a vapor deposition source collides with inner wall surfaces of the metal mask opening of the metal mask and/or the resin mask opening of the resin mask and does not reach the vapor deposition target, and thereby, a portion without vapor deposition that has a film thickness smaller than the intended vapor deposition film thickness arises.

The sectional shape of the resin mask opening 25 is not specially limited but end surfaces that face each other and are of the resin mask forming the resin mask openings 25 may be substantially parallel to each other, but as shown in FIG. 1(a), the sectional shape of the resin mask opening 25 is preferably a shape including broadening toward a vapor deposition source. In other words, it preferably includes a taper surface including broadening toward the metal mask 10 side. While a taper angle can be properly set with the thickness or the like of the resin mask 20 taken into consideration, an angle formed by a straight line connecting the lower bottom distal end in the resin mask opening of the resin mask and the upper bottom distal end of the resin mask opening of the same resin mask and the bottom surface of the resin mask, in other words, an angle formed by an inner wall surface of the resin mask opening 25 and a surface of the resin mask 20 on the side that is not in contact with the metal mask 10 (upper surface of the resin mask in the mode shown in the figure) in the thicknesswise cross section of the inner wall surface constituting the resin mask opening 25 of the resin mask 20 is preferably within a range not less than about 5° and not more than about 85°, still preferably within a range not less than about 15° and not more than about 75°, further preferably within a range not less than about 25° and not more than about 65°. In particular, within this range, it is preferably an angle smaller than a vapor deposition angle of a vapor deposition machine to be used. Moreover, in the mode shown in the figure, while an end surface that forms the resin mask opening 25 exhibits a linear shape, there is no limitation thereto but may be in a curved shape convex outward, in other words, a shape of the entirety of the resin mask opening 25 may be a bowl shape. Conversely, the end surface that forms the resin mask opening 25 may be in a curved shape convex inward.

<Metal Mask>

As shown in FIG. 1(a), the metal mask 10 is stacked on one surface of the resin mask 20. The metal mask 10 is constituted of metal, in which the metal mask openings 15 extending in the lengthwise direction or the crosswise direction are arranged as shown in FIG. 1(b). An arrangement example of the metal mask opening 15 is not specially limited but the metal mask opening 15 extending in the lengthwise direction and the crosswise direction may be arranged in a plurality of rows in the lengthwise direction and the crosswise direction, the metal mask opening 15 extending in the lengthwise direction may be arranged in a plurality of rows in the crosswise direction, and the metal mask openings extending in the crosswise direction may be arranged in a plurality of rows in the lengthwise direction. Moreover, they may be arranged in only one row in the lengthwise direction or the crosswise direction. Moreover, the plurality of metal mask openings 15 may be arranged at random. Moreover, one metal mask opening 15 may be provided. Notably, "lengthwise direction" and "crosswise direction" stated in the specification of the present application mean the vertical direction and the horizontal direction in the drawings, respectively, and may be any directions of the longitudinal directions and the width directions of the vapor deposition mask, the resin mask and the metal mask. For example, the longitudinal direction of the vapor deposition mask, the resin mask or the metal mask may be set to be the "lengthwise direction", or the width direction thereof may be set to be the "lengthwise direction".

(Elongation Part)

As shown in FIG. 2 to FIG. 4, when the metal mask 10 is seen in plan view, the shape of the metal mask opening 15 of the metal mask 10 includes, as a form of a polygon, a rectangle as a basic shape, and the elongation part 35 which is added to the rectangle and elongates the length of the whole periphery of the rectangle. By providing such an elongation part 35, the resonance frequency of the metal mask 10 in the occasion when the elongation part 35 is supposed to be absent can be shifted, and as a result, a probability that the resin mask 20 breaks can be reduced.

Hereafter, various elongation parts 35 are specifically described using FIG. 2 to FIG. 4.

FIG. 2(a) shows the shape of the metal mask opening 15 in the case where the elongation part 35 is absent. As above, a basic shape of the metal mask opening 15 in the vapor deposition mask 100 according to an embodiment of the present disclosure is a rectangle.

The metal mask opening 15 shown in FIG. 2(b) includes the basic shape of a rectangle and the elongation part 35 which includes a plurality of continuous arc shapes protruding outward of the opening 15 across its whole periphery.

The metal mask opening 15 shown in FIG. 2(c) includes the basic shape of a rectangle and the elongation part 35 which includes a plurality of continuous arc shapes protruding inward of the opening 15 across its whole periphery.

The metal mask opening 15 shown in FIG. 2(d) includes the basic shape of a rectangle and the elongation part 35 which includes a plurality of continuous arc shapes protruding both outward and inward of the opening 15 across its whole periphery.

As shown in FIGS. 2(b) to 2(d), the resonance frequency of the metal mask 10 may be shifted with the elongation part 35 which includes a plurality of continuous arc shapes.

Meanwhile, the metal mask opening 15 shown in FIG. 2(e) includes the basic shape of a rectangle and the elongation part 35 which includes a plurality of continuous arc shapes protruding outward of the opening 15 on only one of its sides.

Moreover, the metal mask opening 15 shown in FIG. 2(f) includes the basic shape of a rectangle and the elongation part 35 which includes arc shapes protruding outward of the opening 15 only at its four vertices.

As shown in FIGS. 2(e) and 2(f), the elongation part 35 is not necessarily provided across the whole periphery of the metal mask opening 15 but, in the case where a portion with a high possibility of breakage is beforehand known or the similar case, it may be continuously or intermittently provided only at the portion. Notably, also in this case, it does not necessarily protrude outward but may protrude inward, and may protrude both outward and inward.

The metal mask opening 15 shown in FIG. 3(a) includes the basic shape of a rectangle and the elongation part 35 which includes a plurality of continuous triangle shapes protruding outward of the opening 15 across its whole periphery.

The metal mask opening 15 shown in FIG. 3(b) includes the basic shape of a rectangle and the elongation part 35 which includes a plurality of intermittent triangle shapes protruding outward of the opening 15 across its whole periphery.

The metal mask opening 15 shown in FIG. 3(c) includes the basic shape of a rectangle and the elongation part 35 which includes a plurality of intermittent triangle shapes different in dimension protruding outward of the opening 15 across its whole periphery.

As shown in FIGS. 3(a) to 3(c), the shape of the elongation part 35 is not limited to arc shapes but triangle shapes can also shift the resonance frequency of the metal mask 10.

The metal mask opening 15 shown in FIG. 3(d) includes the basic shape of a rectangle and the elongation part 35 which includes a plurality of intermittent square shapes protruding outward of the opening 15 across its whole periphery.

The metal mask opening 15 shown in FIG. 3(e) includes the basic shape of a rectangle and the elongation part 35 which includes a plurality of intermittent trapezoid shapes protruding outward of the opening 15 across its whole periphery.

The metal mask opening 15 shown in FIG. 3(f) includes the basic shape of a rectangle and the elongation part 35 which includes a plurality of intermittent pentagon shapes protruding outward of the opening 15 across its whole periphery.

The metal mask opening 15 shown in FIG. 3(g) includes the basic shape of a rectangle and the elongation part 35 which includes a plurality of intermittent cross shapes protruding outward of the opening 15 across its whole periphery.

As shown in FIGS. 3(d) to 3(g), the shape of the elongation part 35 is not limited to arc shapes or triangle shapes but various polygon shapes can also disperse stress.

The metal mask opening 15 shown in FIG. 3(h) includes the basic shape of a rectangle and the elongation part 35 which includes a plurality of intermittent shapes having arc shapes and quadrangle shapes combined and protruding outward of the opening 15 across its whole periphery.

As above, shapes having a plurality of shapes combined can also shift the resonance frequency of the metal mask 10.

The metal mask opening 15 shown in FIG. 3(i) includes the basic shape of a rectangle and the elongation part 35 which includes a plurality of intermittent triangle shapes and quadrangle shapes protruding outward of the opening 15 across its whole periphery.

As above, the case where a plurality of shapes are simultaneously included can also lead to shifting of the resonance frequency of the metal mask 10.

The metal mask opening 15 shown in FIG. 4(a) includes the basic shape of a rectangle and the elongation part 35 which includes sine curves on its upper side and its lower side.

The metal mask opening 15 shown in FIG. 4(b) includes the basic shape of a rectangle and the elongation part 35 which has sine curves different in cycle combined only on its upper side.

As shown in FIGS. 4(a) and 4(b), stress can be dispersed also by providing a waveform shape such as a sine curve only at a desired position.

The metal mask opening 15 shown in FIG. 4(c) includes the basic shape of a rectangle and the so-called fractal elongation part 35 in which triangle shapes are unit shapes only on its upper side.

Such a fractal elongation part 35 can also shift the resonance frequency of the metal mask 10.

The shapes of the elongation part 35 shown in FIG. 2 to FIG. 4 above are merely exemplary, and shapes other than these may be employed as long as they can disperse stress, and moreover, they can also be formed by properly combining these.

Moreover, in the vapor deposition mask 100 according to an embodiment of the present disclosure, the elongation parts 35 are not needed to be formed for all the metal mask openings 15 in the metal mask 10, but when a position where stress is concentrated can be specified, the elongation part 35 may be formed for only the metal mask opening 15 existing at that portion. Specifically, the elongation part 35 may be formed for only the metal mask opening 15 positioned at the center part of the metal mask 10, or conversely, the elongation part 35 may be formed for only the metal mask opening 15 positioned close to the outer edge of the metal mask 10.

The material of the metal mask 10 as above is not specially limited but a conventionally known one in the field of the vapor deposition mask can be properly selected and used, and, for example, metal materials such as stainless steel, iron-nickel alloy and aluminum alloy can be cited. Above all, an invar material which is iron-nickel alloy can be preferably used since an invar material is hardly deformed by heat.

Although the thickness of the metal mask 10 is not specially limited, in order to more effectively prevent generation of a shadow, is preferably not more than about 100 µm, still preferably not more than about 50 µm, particularly preferably not more than about 35 µm. Notably, in the case of being thinner than about 5 µm, risks of rupture and deformation tend to increase and handling tends to be difficult.

The sectional shape of the metal mask opening 15 formed in the metal mask 10 is not specially limited but, as shown in FIG. 1(*a*), is preferably a shape including broadening toward a vapor deposition source. More specifically, an angle formed by a straight line connecting the lower bottom distal end in the metal mask opening 15 of the metal mask 10 and the upper bottom distal end in the metal mask opening 15 of the same metal mask 10 and the bottom surface of the metal mask 10, in other words, an angle formed by an inner wall surface of the metal mask opening 15 and a surface of the metal mask 10 on the side that is in contact with the resin mask 20 (upper surface of the metal mask in the mode shown in the figure) in the thicknesswise cross section of the inner wall surface constituting the metal mask opening 15 of the metal mask 10 is preferably within a range of about 5° to about 85°, still preferably within a range of about 15° to about 80°, further preferably within a range of about 25° to about 65°. In particular, within this range, it is preferably an angle smaller than a vapor deposition angle of a vapor deposition machine to be used.

A method of stacking the metal mask 10 on the resin mask is not specially limited but the resin mask 20 and the metal mask 10 may be pasted together using various pressure-sensitive adhesive agents or a resin mask with self-adhesion may be used. The dimensions of the resin mask 20 and the metal mask 10 may be the same as or different from each other. Notably, with fixation to a frame which is arbitrarily performed after that taken into consideration, the dimension of the resin mask 20 is preferably made smaller than that of the metal mask 10 to realize the state where the outer circumferential portion of the metal mask 10 is exposed, so that the metal mask 10 can be easily fixed to a frame.

(Vapor Deposition Method Using Vapor Deposition Mask)

A vapor deposition method used for forming a vapor deposition pattern using the vapor deposition mask of the present disclosure is not specially limited but, for example, physical vapor deposition (PVD) methods such as a reactive sputtering method, a vacuum vapor deposition method, ion plating, and an electron beam vapor deposition method, chemical vapor deposition (CVD) methods such as thermal CVD, plasma CVD and photo-CVD methods, and the like can be cited. Moreover, a vapor deposition pattern can be formed using a conventionally known vacuum vapor deposition apparatus or the like.

(Another Embodiment of Vapor Deposition Mask)

While in the vapor deposition mask 100 according to an embodiment of the present disclosure described above, the basic shape of the metal mask opening 15 of the metal mask 10 constituting this is a rectangle, without limitation to this, it can attain the aforementioned effects as long as it is a shape the basic shape of which is a polygon other than a rectangle, such as a triangle, a pentagon, a hexagon or the like, and which is obtained by adding an elongation part for elongating the length of the whole periphery of the polygon.

FIG. 5 shows elevation views exemplarily showing shapes of the metal mask opening as the vapor deposition mask according to another embodiment of the present disclosure is seen from the metal mask side in plan view.

FIG. 5(*a*) shows the shape of the metal mask opening 15 in the case where the elongation part 35 is absent. As above, a basic shape of the metal mask opening 15 in the vapor deposition mask 100 according to an embodiment of the present disclosure may be a triangle.

The metal mask opening 15 shown in FIG. 5(*b*) includes the basic shape of a triangle and the elongation part 35 which includes a plurality of continuous arc shapes protruding outward of the opening 15 across its whole periphery.

The metal mask opening 15 shown in FIG. 5(*c*) includes the basic shape of a triangle and the elongation part 35 which includes arc shapes protruding outward of the opening 15 only at its three vertices.

The metal mask opening 15 shown in FIG. 5(*d*) includes the basic shape of a triangle and the elongation part 35 which includes a plurality of continuous arc shapes protruding both outward and inward of the opening across its whole periphery.

The metal mask opening 15 shown in FIG. 5(*e*) includes the basic shape of a triangle and the elongation part 35 which includes a plurality of continuous triangle shapes protruding outward of the opening 15 across its whole periphery.

The metal mask opening 15 shown in FIG. 5(*f*) includes the basic shape of a triangle and the elongation part 35 which includes a plurality of intermittent square shapes protruding outward of the opening across its whole periphery.

The metal mask opening 15 shown in FIG. 5(*g*) includes a shape having those in FIG. 5(*c*) and FIG. 5(*f*) mentioned above combined. Specifically, it includes the basic shape of a triangle, the elongation part 35 which includes arc shapes protruding outward of the opening 15 at its three vertices, and the elongation part 35 which includes a plurality of intermittent square shapes protruding outward of the opening on its three sides.

Figure 6:
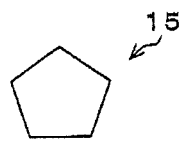
FIGS. 6(a)-(g) show elevation views exemplarily showing shapes of the metal mask opening as the vapor deposition mask according to still another embodiment of the present disclosure is seen from the metal mask side in plan view.
Figure 6:
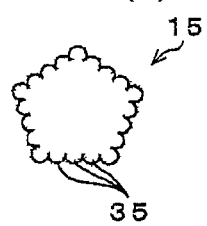
Figure 6:
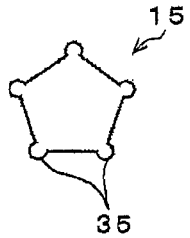
Figure 6:
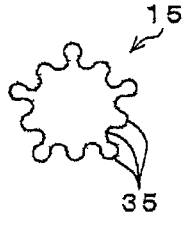
Figure 6:
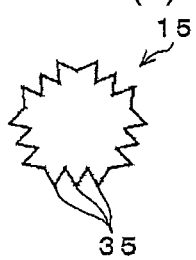
Figure 6:
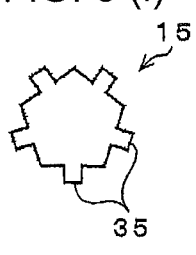
Figure 6:
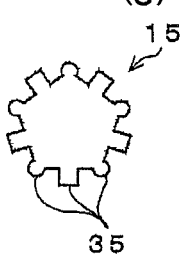

FIG. 6 shows elevation views exemplarily showing shapes of the metal mask opening as the vapor deposition mask according to still another embodiment of the present disclosure is seen from the metal mask side in plan view.

FIG. 6(*a*) shows the shape of the metal mask opening 15 in the case where the elongation part 35 is absent. As above, a basic shape of the metal mask opening 15 in the vapor deposition mask 100 according to an embodiment of the present disclosure may be a pentagon.

The metal mask opening 15 shown in FIG. 6(*b*) includes the basic shape of a pentagon and the elongation part 35 which includes a plurality of continuous arc shapes protruding outward of the opening 15 across its whole periphery.

The metal mask opening 15 shown in FIG. 6(*c*) includes the basic shape of a pentagon and the elongation part 35 which includes arc shapes protruding outward of the opening 15 only at its five vertices.

The metal mask opening 15 shown in FIG. 6(*d*) includes the basic shape of a pentagon and the elongation part 35 which includes a plurality of continuous arc shapes protruding both outward and inward of the opening across its whole periphery.

The metal mask opening 15 shown in FIG. 6(*e*) includes the basic shape of a pentagon and the elongation part 35 which includes a plurality of continuous triangle shapes protruding outward of the opening 15 across its whole periphery.

The metal mask opening 15 shown in FIG. 6(*f*) includes the basic shape of a pentagon and the elongation part 35 which includes a plurality of intermittent square shapes protruding outward of the opening across its whole periphery.

The metal mask opening 15 shown in FIG. 6(*g*) includes a shape having those in FIG. 6(*c*) and FIG. 6(*f*) mentioned above combined. Specifically, it includes the basic shape of a pentagon, the elongation part 35 which includes arc shapes protruding outward of the opening 15 at its five vertices, and the elongation part 35 which includes a plurality of intermittent square shapes protruding outward of the opening on its five sides.

Figure 7:
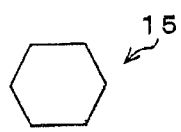
FIGS. 7(a)-(g) show elevation views exemplarily showing shapes of the metal mask opening as the vapor deposition mask according to still another embodiment of the present disclosure is seen from the metal mask side in plan view.
Figure 7:
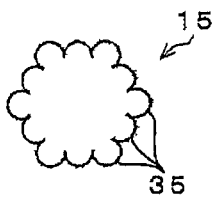
Figure 7:
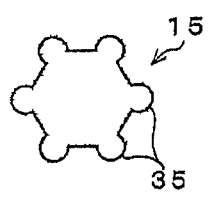
Figure 7:
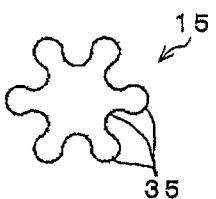
Figure 7:
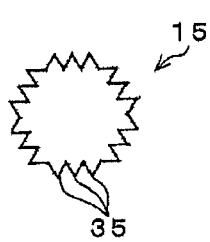
Figure 7:
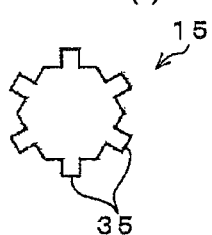
Figure 7:
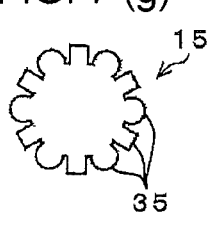

FIG. 7 shows elevation views exemplarily showing shapes of the metal mask opening as the vapor deposition mask according to still another embodiment of the present disclosure is seen from the metal mask side in plan view.

FIG. 7(*a*) shows the shape of the metal mask opening 15 in the case where the elongation part 35 is absent. As above, a basic shape of the metal mask opening 15 in the vapor deposition mask 100 according to an embodiment of the present disclosure may be a hexagon.

The metal mask opening 15 shown in FIG. 7(*b*) includes the basic shape of a hexagon and the elongation part 35 which includes a plurality of continuous arc shapes protruding outward of the opening 15 across its whole periphery.

The metal mask opening 15 shown in FIG. 7(*c*) includes the basic shape of a hexagon and the elongation part 35 which includes arc shapes protruding outward of the opening 15 only at its five vertices.

The metal mask opening 15 shown in FIG. 7(*d*) includes the basic shape of a hexagon and the elongation part 35 which includes a plurality of continuous arc shapes protruding both outward and inward of the opening across its whole periphery.

The metal mask opening 15 shown in FIG. 7(*e*) includes the basic shape of a hexagon and the elongation part 35 which includes a plurality of continuous triangle shapes protruding outward of the opening 15 across its whole periphery.

The metal mask opening 15 shown in FIG. 7(*f*) includes the basic shape of a hexagon and the elongation part 35 which includes a plurality of intermittent square shapes protruding outward of the opening across its whole periphery.

The metal mask opening 15 shown in FIG. 7(*g*) includes a shape having those in FIG. 7(*c*) and FIG. 7(*f*) mentioned above combined. Specifically, it includes the basic shape of a hexagon, the elongation part 35 which includes arc shapes protruding outward of the opening 15 at its six vertices, and the elongation part 35 which includes a plurality of intermittent square shapes protruding outward of the opening on its six sides.

As above, the cases where the basic shape of the metal mask opening 15 in the vapor deposition mask 100 according to an embodiment of the present disclosure takes a rectangle, a triangle, a pentagon and a hexagon have been exemplarily described, and not limited to these, it may be a polygon, and it is not necessarily a regular polygon.

<<Vapor Deposition Mask Including Rigidity Adjustment Part in Metal Mask>>

In the vapor deposition mask according to an embodiment of the present disclosure described above, the metal mask constituting this may include one or a plurality of rigidity adjustment parts that partially reduce rigidity of the metal mask at a position not overlapping with the resin mask openings of the resin mask.

By providing, in a predetermined portion of the metal mask, the rigidity adjustment part that reduces the rigidity of the portion, ability of the metal mask to meet the resin mask deformed can be improved, and as a result, a probability that the resin mask breaks can be reduced.

The rigidity adjustment part in the vapor deposition mask in which the metal mask according to an embodiment of the present disclosure includes the rigidity adjustment part as above is hereafter described using the drawings. Notably, in the drawings below, the aforementioned elongation part provided at the metal mask opening is omitted.

(Rigidity Adjustment Part)

As shown in FIG. 8 to FIG. 19, the metal mask 10 in the vapor deposition mask 100 according to an embodiment of the present disclosure includes one or a plurality of rigidity adjustment parts 36 that partially reduce rigidity of the metal mask 10 at a position not overlapping with the resin mask openings 25 of the resin mask 20. Specifically, in each of the arrangement regions 30 shown in FIG. 8 to FIG. 10 and FIG. 16 to FIG. 19, one or a plurality of rigidity adjustment parts 36 for partially reducing rigidity of the metal mask 10 are positioned.

Notably, the rigidity of a metal mask stated in the specification of the present application means the degree of ease of deformation of the metal mask (sometimes referred to as displacement or displacement amount) in a region on which certain load is exerted when the load is exerted on the vapor deposition mask, and the rigidity of the metal mask decreases more as the rigidity becomes lower, in other words, as the displacement amount becomes larger. The rigidity of the metal mask can be calculated by the following expression (1). Specifically, rigidity (k) of the metal mask can be calculated by exerting normal load (F) on a predetermined region of the vapor deposition mask 100, and measuring a displacement amount (δ) of the metal mask in the region on which the normal load (F) is exerted. Measurement of the displacement amount (δ) of the metal mask can be performed, for example, using a laser displacement meter or the like. Moreover, as a method of exerting the normal load, for example, a method of placing a weight with a predetermined mass in a predetermined region, a device of exerting load, or the like can be used.

$$k=F/\delta \qquad (1)$$

With the vapor deposition mask 100 of the present disclosure, by positioning the rigidity adjustment part 36 in the arrangement region 30, the rigidity of the metal mask 10 in the arrangement region 30 can be reduced more than the rigidity in a region in which the rigidity adjustment part 36 is not arranged. In other words, by setting the metal mask 10 to include the rigidity adjustment part 36, softness can be given to the metal mask. According to the vapor deposition mask 100 of the present disclosure, softness given to the metal mask 10 can improve ability of the metal mask 10 to meet the resin mask 20, and as a result, a probability that the resin mask 20 breaks can be reduced.

A method of partially reducing rigidity of the metal mask 10 by the rigidity adjustment part 36 is not specially limited but can be realized by various methods as exemplarily presented below. Moreover, the rigidity of a metal mask can also be partially reduced by methods other than those.

(i) For example, by providing one or a plurality of through holes 40 penetrating the metal mask 10 as the rigidity adjustment parts 36 in a predetermined region of the metal mask not overlapping with the resin mask openings 25 in the thicknesswise direction, in other words, in a region whose rigidity is desired to be reduced, the rigidity of the metal mask 10 in a peripheral region including the through holes 40 can be reduced (refer to FIGS. 11(b) and 5(c) and FIG. 15(b)).

The through hole 40 stated here means a hole penetrating only the metal mask 10. A method of forming the through hole 40 is not specially limited but etching, cutting or the like can be properly selected and performed.

Figure 11:
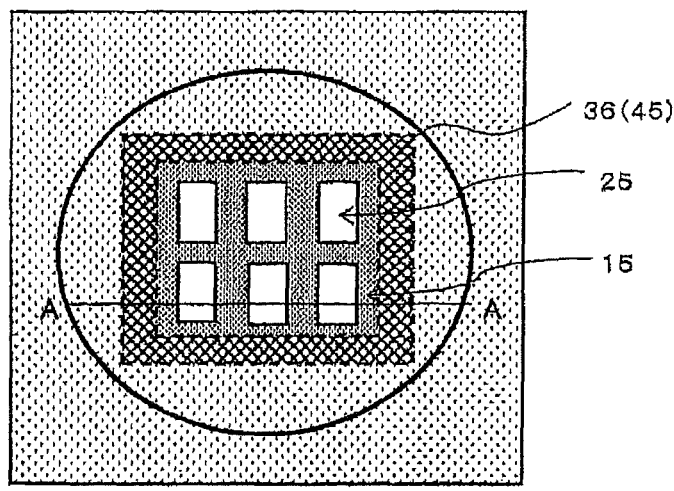
FIGS. 11(a)-(c) show expanded elevation views exemplarily showing a region designated by sign X in FIG. 1(b).
Figure 11:
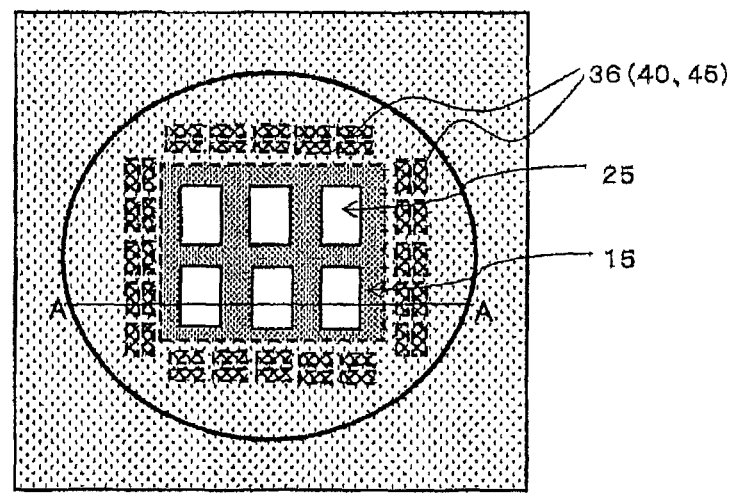
Figure 11:
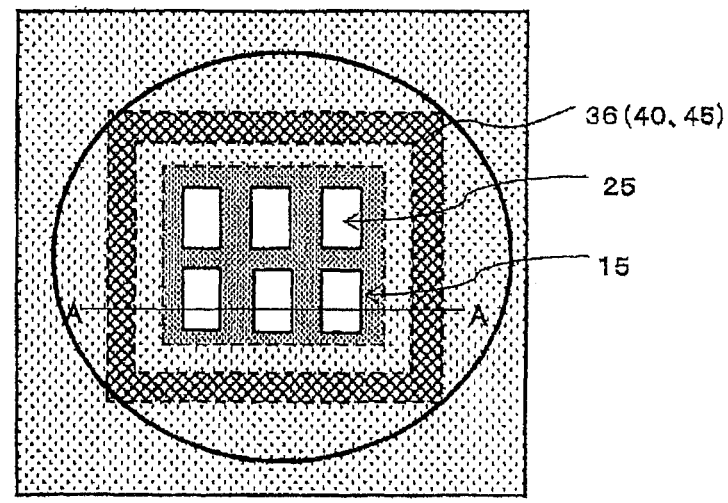
Figure 15:
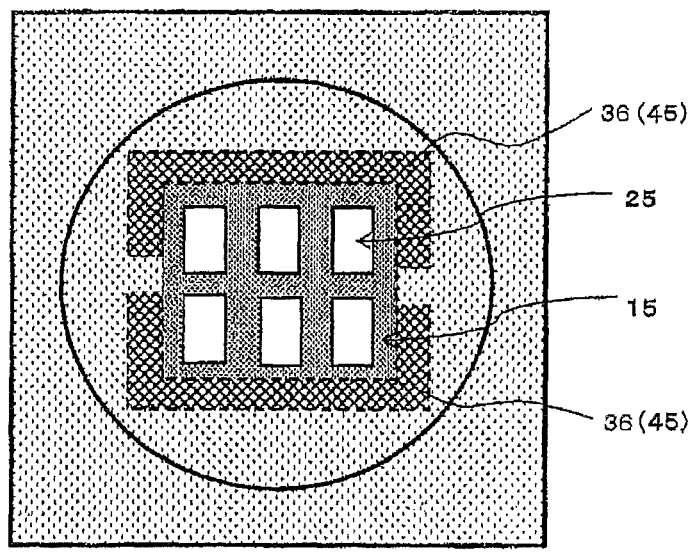
FIGS. 15(a)-(b) show expanded elevation views exemplarily showing the region designated by the sign X in FIG. 1(b).
Figure 15:
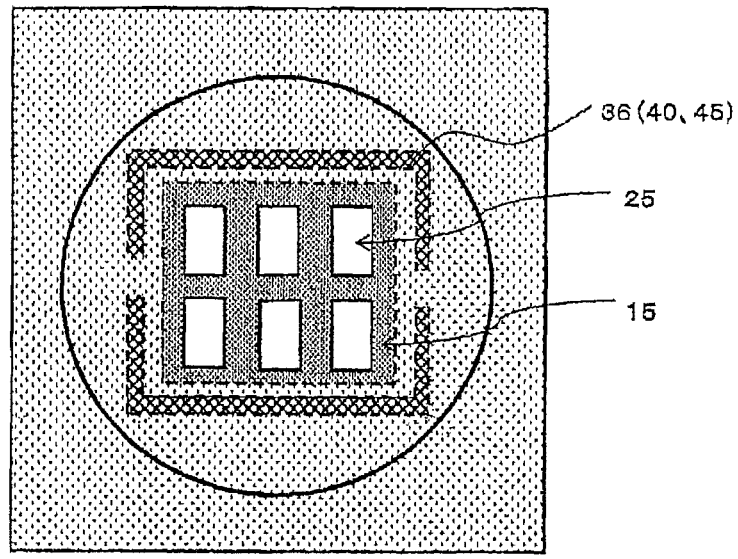
Figure 16:
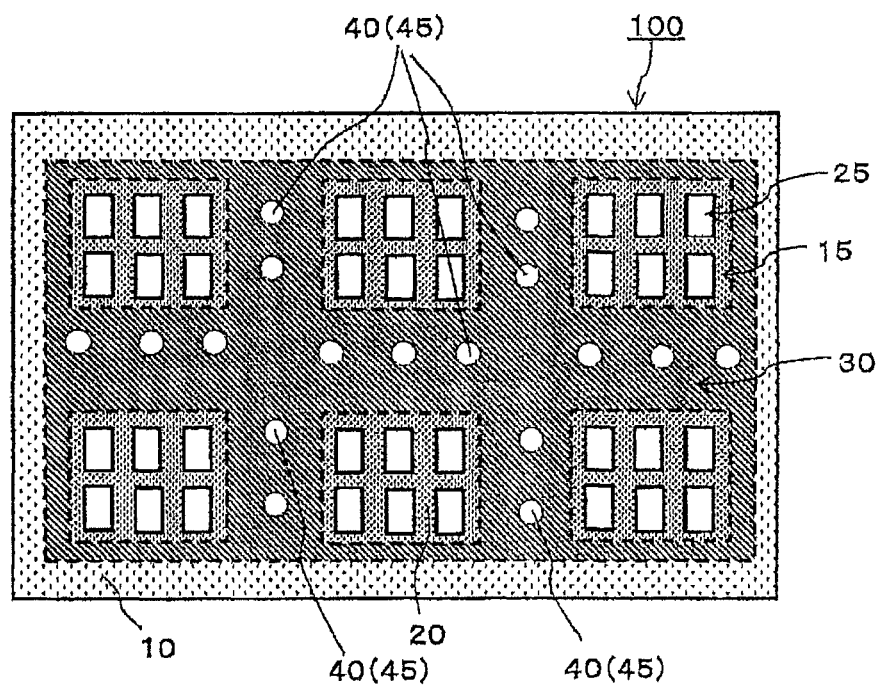
FIGS. 16(a)-(b) show elevation views exemplarily showing a vapor deposition mask according to an embodiment of the present disclosure as seen from the metal mask side in plan view.
Figure 16:
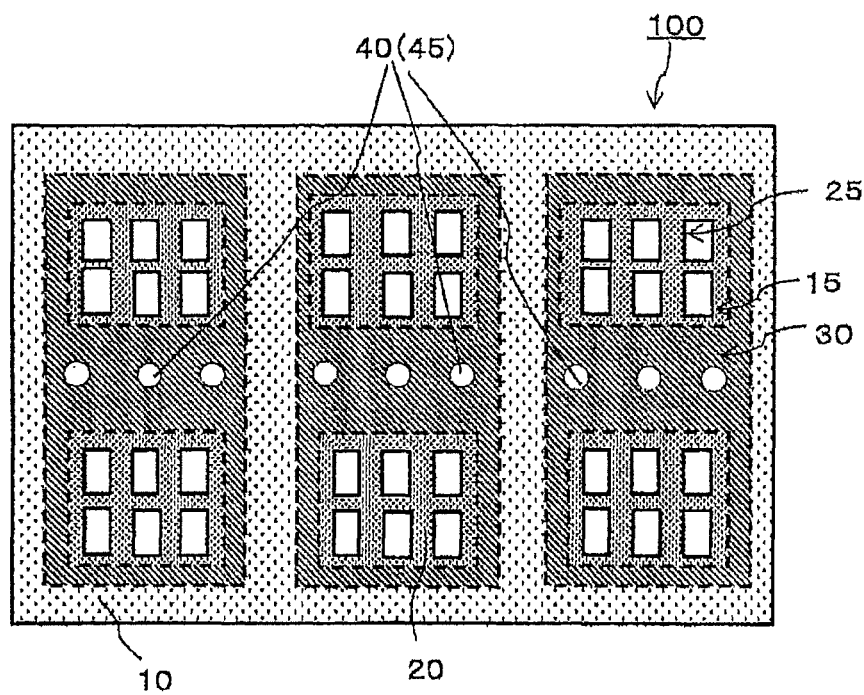
Figure 17:
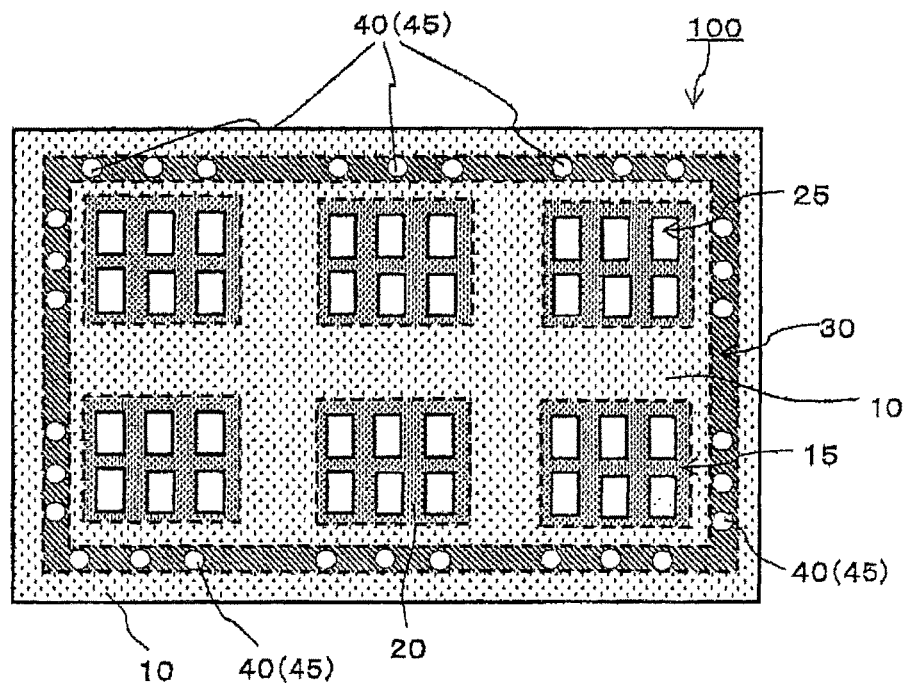
FIGS. 17(a)-(b) show elevation views exemplarily showing a vapor deposition mask according to an embodiment of the present disclosure as seen from the metal mask side in plan view.
Figure 17:
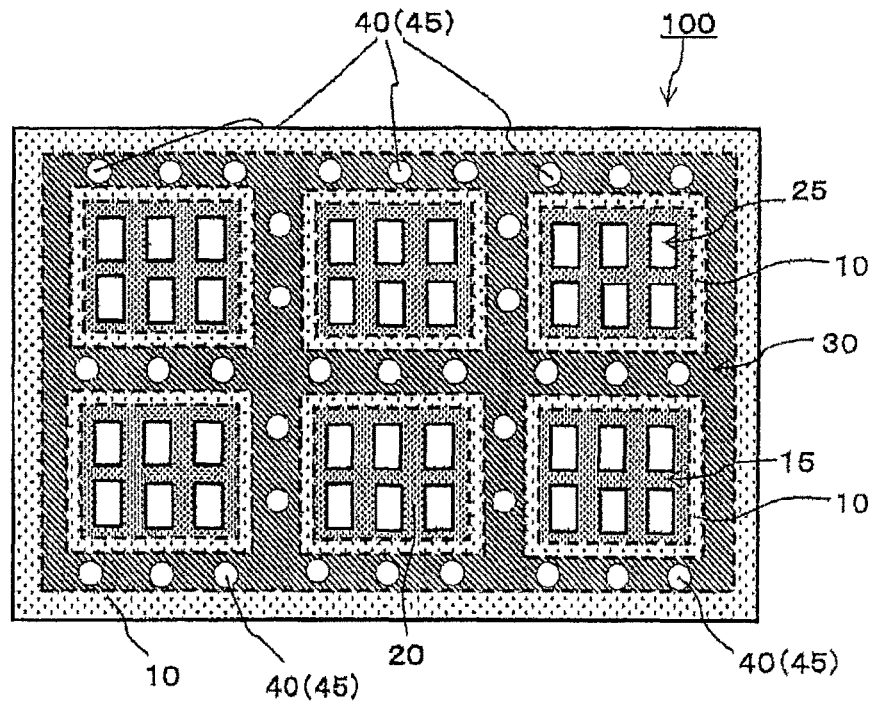

(ii) Moreover, by providing one or a plurality of recess parts 45 not penetrating the metal mask 10 as the rigidity adjustment parts 36 in a predetermined region of the metal mask not overlapping with the resin mask openings 25 in the thicknesswise direction, in other words, in a region whose rigidity is desired to be reduced, the rigidity of the metal mask 10 in a peripheral region including the recess parts 45 can also be reduced (refer to FIG. 11 and FIG. 15).

A method of forming the recess part 45 is not specially limited but etching, cutting or the like can be properly selected and performed. The depth of the recess part 45 is not specially limited but can be properly set with the thickness of the metal mask 10 and the degree of reduction of rigidity taken into consideration. By way of example, it is within a range not less than about 1 μm and not more than about 100 μm.

Hereafter, unless otherwise noted, when the rigidity adjustment parts 36 are stated, they are supposed to include the through holes 40 and the recess parts 45 as the rigidity adjustment parts 36.

The shape of the through hole 40 or the recess part 45 as the rigidity adjustment part 36 is not specially limited but, for example, as a shape thereof as the vapor deposition mask 100 is seen from the metal mask 10 side in plan view, polygonal shapes such as a triangle, a rectangle, a rhombus, a trapezoid, a pentagon and a hexagon, a circular shape, an ellipsoid shape, shapes with curvatures at corners of polygons, and the like can be cited. Moreover, it can also be a shape obtained by combining these.

Figure 20:
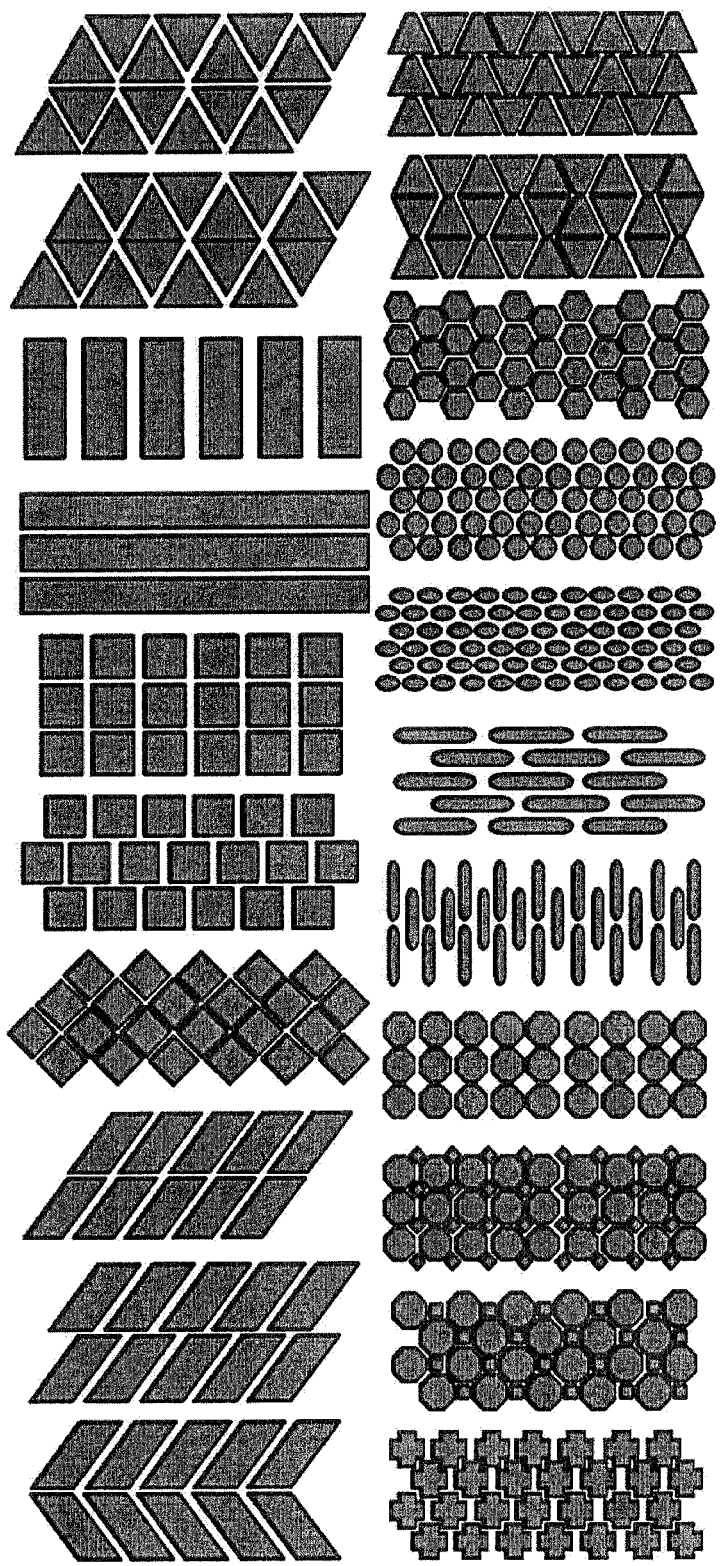
FIG. 20 shows diagrams exemplarily showing rigidity adjustment parts.
Figure 21:
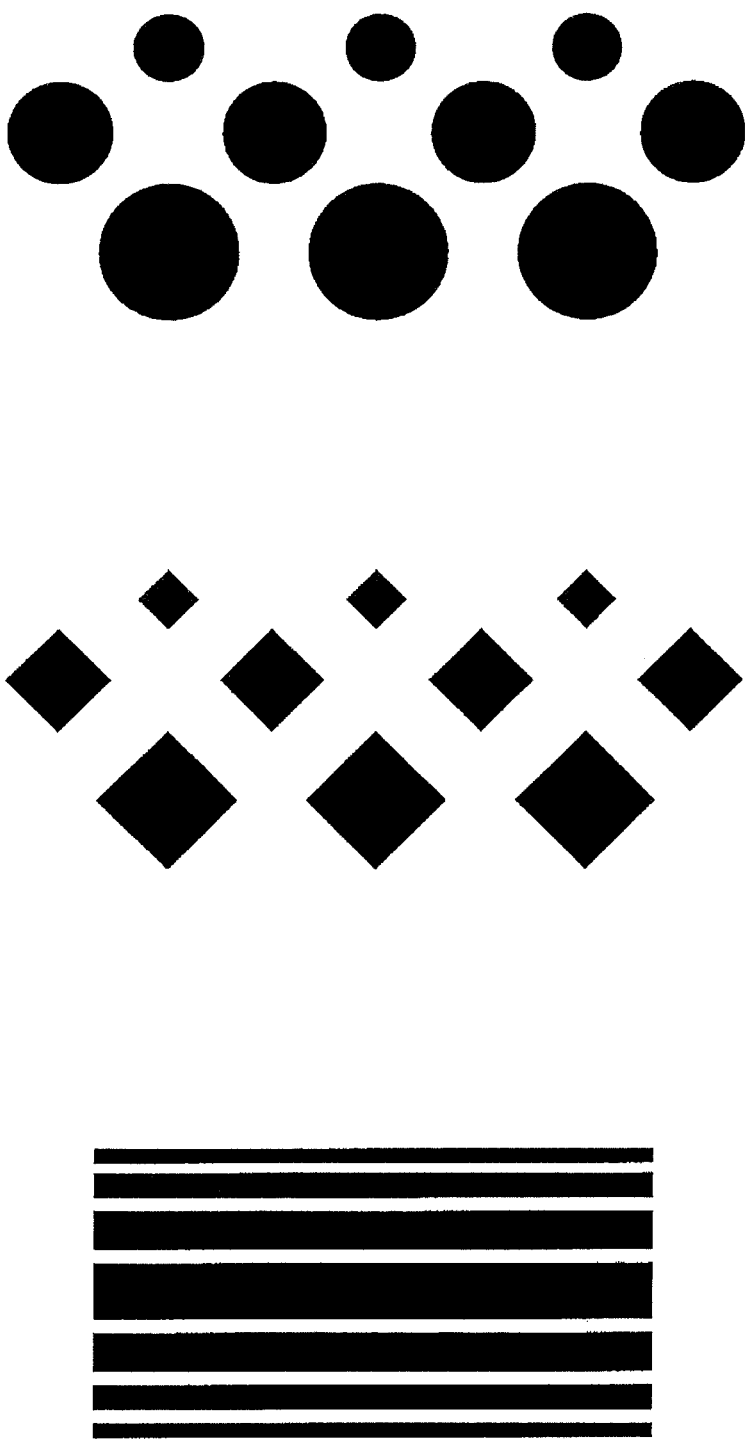
FIG. 21 shows diagrams exemplarily showing rigidity adjustment parts.

FIG. 20 and FIG. 21 show diagrams exemplarily showing aggregates of "rigidity adjustment parts" as seen from the metal mask 10 side in plan view. Notably, in FIG. 20 and FIG. 21, a closed region may be set to be the rigidity adjustment part 36, or such a closed region can also be set to be a non-through hole or a non-recess part. Moreover, as shown in FIG. 21, in the case where a plurality of rigidity adjustment parts 36 are provided, the dimensions of those are not necessarily the same as one another, and the rigidity adjustment parts 36 different in dimension may be mixed. Moreover, as shown in FIG. 21, they may form so-called gradations as a whole.

The dimension of the through hole 40 or the recess part 45 as the rigidity adjustment part 36 is not specially limited but only has to be properly set depending on a place where the rigidity adjustment part 36 is positioned. For example, the area of the opening region of the rigidity adjustment part 36 as seen from the metal mask side in plan view may be made larger or smaller than or the same as the area of the opening region of the metal mask opening 15. Notably, with easiness in adjusting the rigidity of the metal mask 10 taken into consideration, the area of the opening region of one rigidity adjustment part 36 is preferably made smaller than the area of the opening region of the metal mask opening 15. By way of example, the area of the opening region of one rigidity adjustment part 36, in other words, the area of the opening region of one through hole 40 or one recess part 45 is within a range not less than about 1 μm$^2$ and not more than about 1×10$^{12}$ μm$^2$.

The opening width of the through hole 40 or the recess part 45 as the rigidity adjustment part 36 is not specially limited but, for example, the opening widths of the rigidity adjustment part 36 in the longitudinal direction and the width direction of the vapor deposition mask as seen from the metal mask side in plan view may be made larger or smaller than or the same widths as the opening widths of the metal mask opening 15 in the longitudinal direction and the width direction of the vapor deposition mask. Notably, the opening width of the rigidity adjustment part 36 only has to be properly set depending on a place where the through hole 40 is positioned and, for example, when the metal mask 10 includes a plurality of metal mask openings 15 and the rigidity adjustment part 36 is positioned between the adjacent metal mask openings 15 in the longitudinal direction of the vapor deposition mask, the opening width of the rigidity adjustment part 36 in the longitudinal direction as seen from the metal mask 10 side in plan view only has to be made smaller than the distance between the adjacent metal mask openings 15 in the longitudinal direction. The same holds true for the case where the rigidity adjustment part 36 is positioned between the adjacent metal mask openings 15 in the width direction of the vapor deposition mask.

Moreover, when the area of a metal mask effective region as the metal mask that is assumed not to include the rigidity adjustment part(s) 36, in other words, the metal mask only including the metal mask openings 15 is seen from the metal mask side in plan view is 100%, the total area of the opening region(s) of the through hole(s) 40 or the recess part(s) 45 as the rigidity adjustment part(s) 36 as the vapor deposition mask 100 of the present disclosure is seen from the metal mask 10 side in plan view is preferably not less than about 3%, more preferably not less than about 10%, particularly preferably not less than about 30%. Notably, the area of the metal mask effective region stated here means the surface area of the portion where metal portions exist as the vapor deposition mask is seen from the metal mask 10 side in plan view. By setting the ratio of the area of the opening region(s) of the through hole(s) 40 or the recess part(s) 45 as the rigidity adjustment part(s) 36 to be within the aforementioned preferable range, softness can be given to the metal mask 10 while the rigidity of the metal mask 10 as a whole is being sufficiently held, and close contact between the resin mask 20 of the vapor deposition mask 100 and the vapor deposition target can be further improved. The upper limit value of the total area of the opening region(s) of the rigidity adjustment part(s) 36 is not specially limited but with the rigidity of the metal mask taken into consideration, it is preferably not more than about 95%, still preferably not more than about 90%, particularly preferably not more than about 70%.

Arrangement positions and pitches of the rigidity adjustment parts 36, in other words, the through holes 40 or the recess parts 45 as the rigidity adjustment parts described above are not specially limited but they may be regularly arranged or may be arranged at random. Moreover, as an example of the pitch between the adjacent rigidity adjustment parts 36, a range not less than about 1 μm and not more than about 2×10$^6$ μm can be cited.

Moreover, when a plurality of rigidity adjustment parts 36 are provided in the metal mask 10, the areas of the opening regions of the individual rigidity adjustment parts 36 may be the same as one another or may be different from one another. The same holds true for the pitches thereof. Moreover, the through hole 40 and the recess part 45 as the rigidity adjustment part 36 can also be combined and used.

(Rigidity Adjustment Part Arrangement Region)

An arrangement region in which the rigidity adjustment part 36 is arranged is not specially limited but it only has to be properly arranged at a place where the rigidity of the metal mask 10 is desired to be reduced, in other words, at a position with a high possibility of destruction of the resin mask 20, for example, in the periphery of the metal mask opening 15. As shown in FIG. 8 to FIG. 10 and FIG. 16 to FIG. 19, on the metal mask 10 in a preferable mode, the arrangement region 30 is positioned in the periphery of the metal mask opening 15, and in the arrangement region 30, one or a plurality of rigidity adjustment parts 36 are arranged. According to the vapor deposition mask 100 of the present disclosure including the metal mask 10 in a preferable mode, a probability that the resin mask breaks can be reduced.

Figure 8:
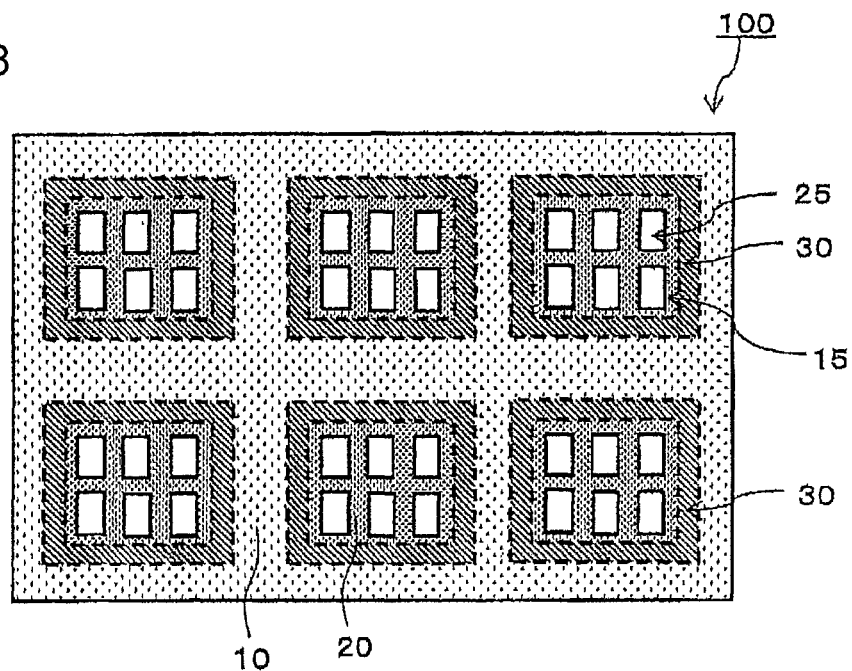
FIG. 8 is an elevation view exemplarily showing a vapor deposition mask according to an embodiment of the present disclosure as seen from the metal mask side in plan view.
Figure 9:
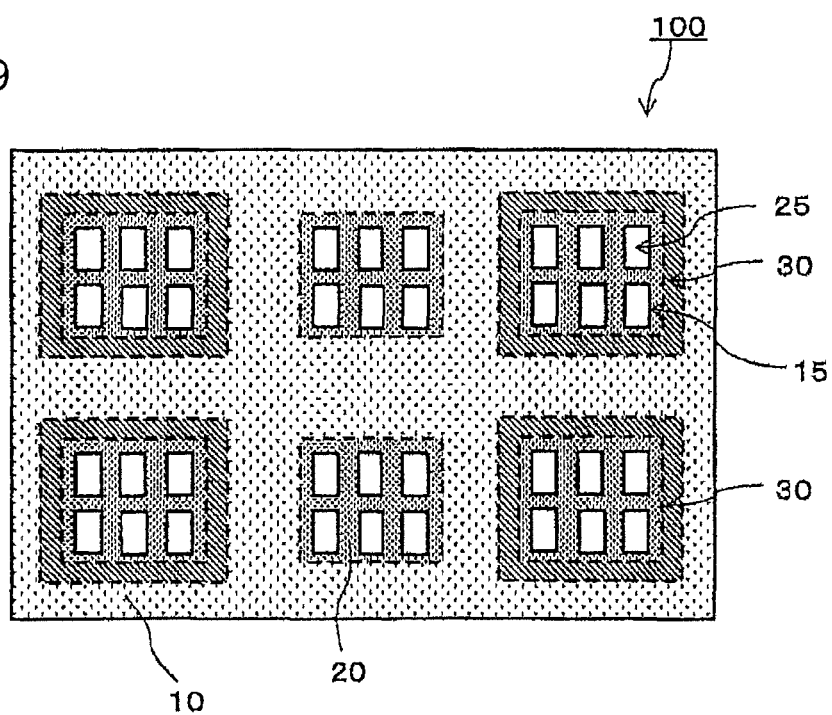
FIG. 9 is an elevation view exemplarily showing a vapor deposition mask according to an embodiment of the present disclosure as seen from the metal mask side in plan view.
Figure 10:
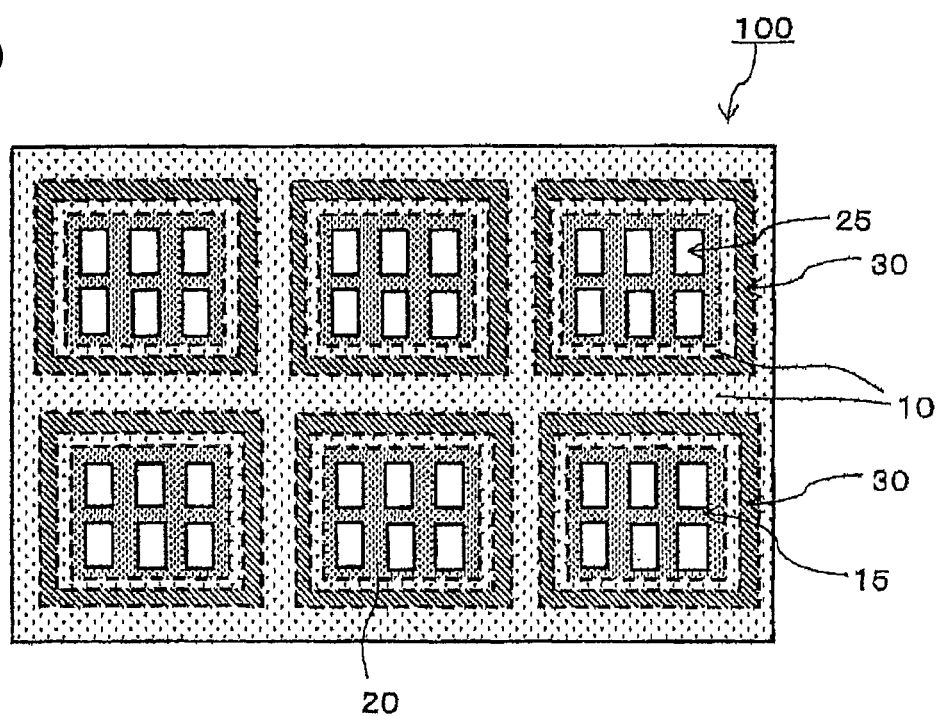
FIG. 10 is an elevation view exemplarily showing a vapor deposition mask according to an embodiment of the present disclosure as seen from the metal mask side in plan view.

In the vapor deposition masks 100 in the modes shown in FIG. 8 and FIG. 9, the metal mask 10 includes a plurality of metal mask openings 15, and the arrangement region 30 is positioned so as to enclose the metal mask opening 15. Notably, in the mode shown in FIG. 2, the arrangement region 30 is positioned such that it encloses the metal mask opening 15 and the outer edge of the metal mask opening 15 overlaps with an outer edge of the arrangement region 30. Moreover, in the mode shown in FIG. 9, the arrangement region 30 is positioned such that it encloses at least one metal mask opening 15 of the plurality of metal mask openings 15 and the outer edge of the metal mask opening 15 overlaps with an outer edge of the arrangement region 30. Moreover, in the mode shown in FIG. 10, the arrangement region 30 is positioned such that it encloses the metal mask opening 15 and the outer edge of the metal mask opening 15 does not overlap with the outer edge of the arrangement region 30, in other words, it is spaced at a predetermined distance from the outer edge of the metal mask opening 15.

Figure 12:
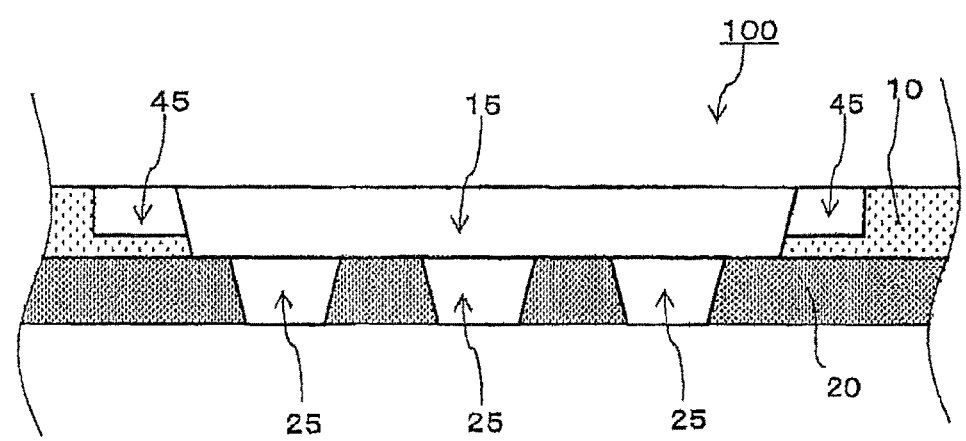
FIG. 12 exemplarily shows a schematic cross-sectional view taken along the line A-A in FIG. 11(a).
Figure 13:
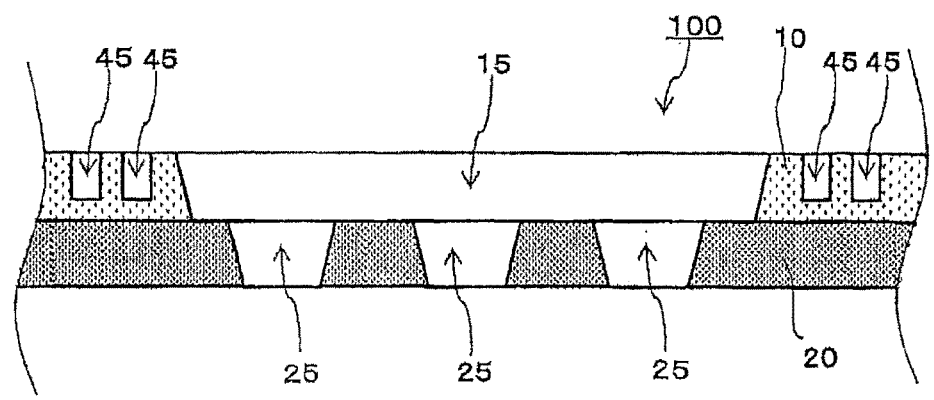
FIGS. 13(a)-(b) exemplarily shows-show schematic cross-sectional views taken along the line A-A in FIG. 11(b).
Figure 13:
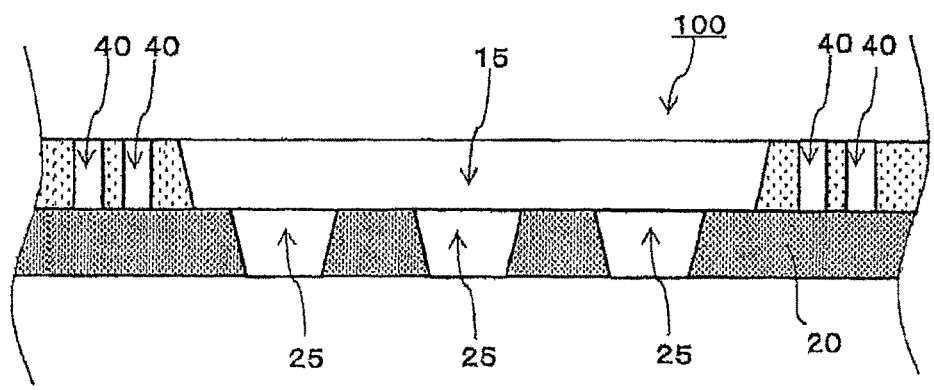
Figure 14:
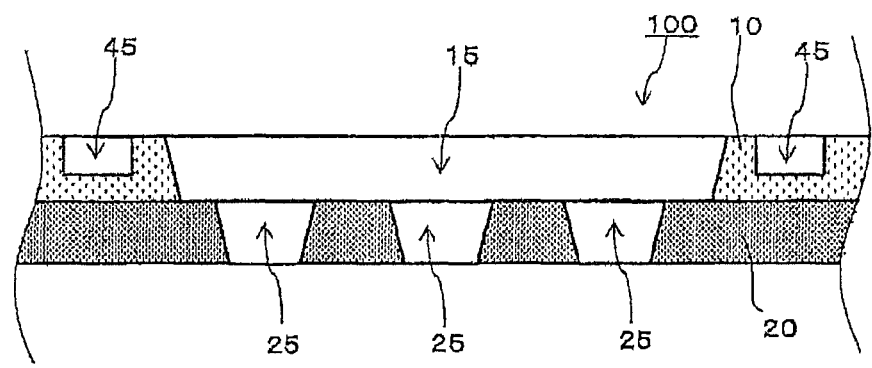
FIGS. 14(a)-(b) exemplarily show schematic cross-sectional views taken along the line A-A in FIG. 11(c).
Figure 14:
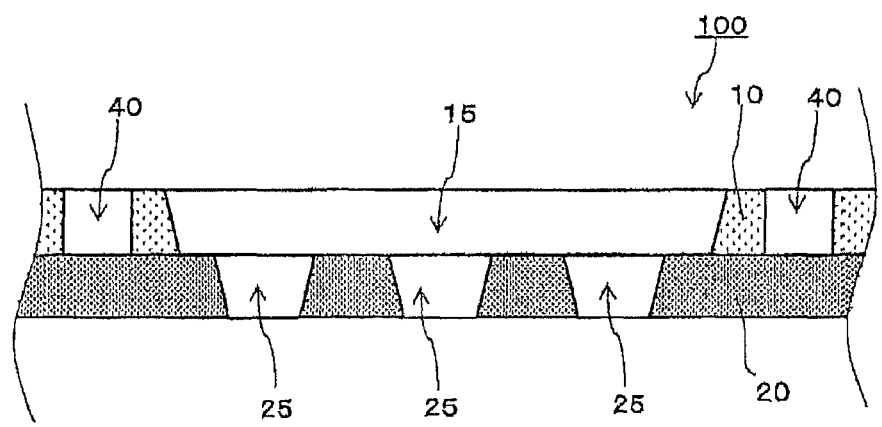

FIG. 11 and FIG. 15 are expanded elevation views (expanded elevation views exemplarily showing the region designated by sign X in FIG. 1(b)) exemplarily showing arrangements of the rigidity adjustment part(s) 36 arranged in the arrangement region 30, FIG. 12 exemplarily shows a schematic cross-sectional view taken along the line A-A in FIG. 11(a), FIGS. 13(a) and 13(b) exemplarily show schematic cross-sectional views taken along the line A-A in FIG. 11(b), and FIGS. 14(a) and 14(b) exemplarily show schematic cross-sectional views taken along the line A-A in FIG. 11(c). In the mode shown in FIG. 11(a), the recess part 45 as one continuous rigidity adjustment part 36 encloses one metal mask opening 15 such that the outer edge of the metal mask opening 15 overlaps with an outer edge of the rigidity adjustment part 36. Moreover, in the mode shown in FIG. 11(b), an aggregate of a plurality of rigidity adjustment parts 36 encloses one metal mask opening 15 such that the outer edge of metal mask opening 15 does not overlap with the outer edges of the rigidity adjustment parts 36. The rigidity adjustment part 36 in the mode shown in FIG. 11(b) may be any of the through hole 40 and the recess part 45. Moreover, in the mode shown in FIG. 11(c), one continuous rigidity adjustment part 36 encloses one metal mask opening 15 such that the outer edge of the metal mask opening 15 does not overlap with the outer edge of the rigidity adjustment part 36. The rigidity adjustment part 36 shown in FIG. 11(c) may be one continuous through hole 40 or one continuous recess part 45. Moreover, a configuration obtained by combining these modes may be employed.

Moreover, the rigidity adjustment part 36 shown in each figure can also be divided into a plurality of rigidity adjustment parts 36. FIG. 15(a) shows a mode in which one rigidity adjustment part 36 shown in FIG. 11(a) is divided into a plurality of rigidity adjustment parts 36, and FIG. 15(b) shows a mode in which one rigidity adjustment part 36 shown in FIG. 11(c) is divided into a plurality of rigidity adjustment parts 36. Moreover, the modes shown in the figures can also be properly combined.

In the vapor deposition masks 100 in the modes shown in FIGS. 16(a) and 16(b) and FIGS. 17(a) and 17(b), the metal mask 10 includes a plurality of metal mask openings 15, and the arrangement region 30 is positioned so as to collectively enclose the plurality of metal mask openings 15. Notably, in the mode shown in FIG. 16, the outer edges of the metal mask openings 15 overlap with outer edges of the arrangement region 30, and in the mode shown in FIG. 17, the outer edges of the arrangement region 30 are positioned to be spaced at predetermined distances from the outer edges of the metal mask openings 15. While in the modes shown in FIG. 16 and FIG. 17, a plurality of rigidity adjustment parts 36 are arranged in the arrangement region 30, the whole arrangement region 30 may be set to be the recess part 45 in the mode shown in FIG. 16, Moreover, in the mode shown in FIG. 17, the whole arrangement region 30 may be set to be the through hole 40 or the recess part 45.

Figure 18:
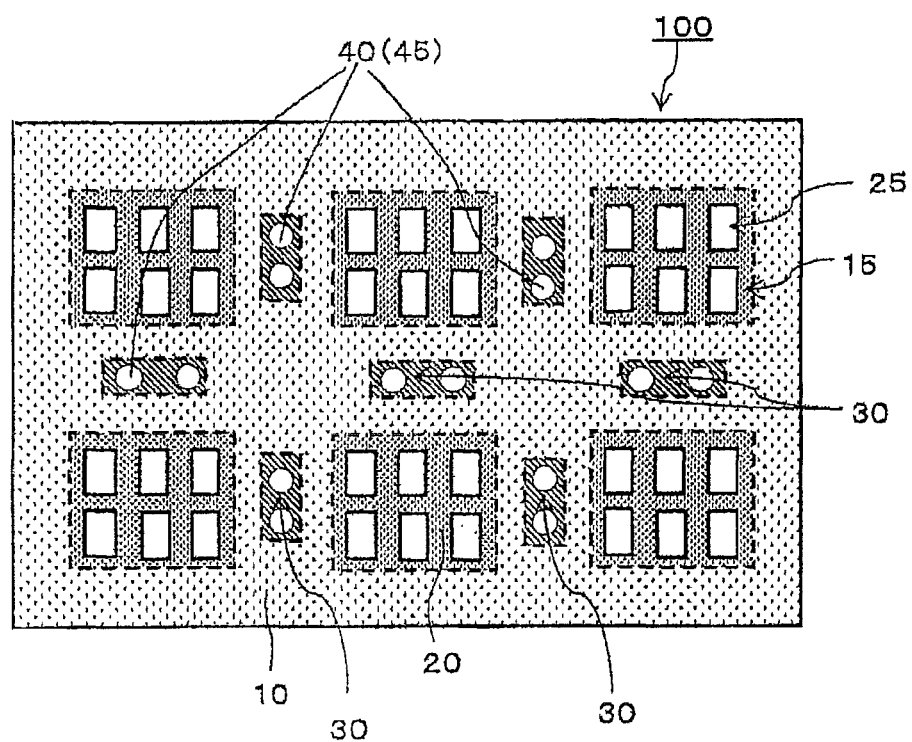
FIG. 18 shows an elevation view exemplarily showing a vapor deposition mask according to an embodiment of the present disclosure as seen from the metal mask side in plan view.

In the vapor deposition mask 100 in the mode shown in FIG. 18, the metal mask 10 includes a plurality of metal mask openings 15, and the arrangement regions 30 are positioned between at least part of adjacent pairs of the metal mask openings 15. While in the mode shown in FIG. 18, a plurality of rigidity adjustment parts 36 are arranged in the arrangement region 30, the whole arrangement region 30 may be the through hole 40 or the recess part 45 in the mode shown in FIG. 18.

Figure 19:
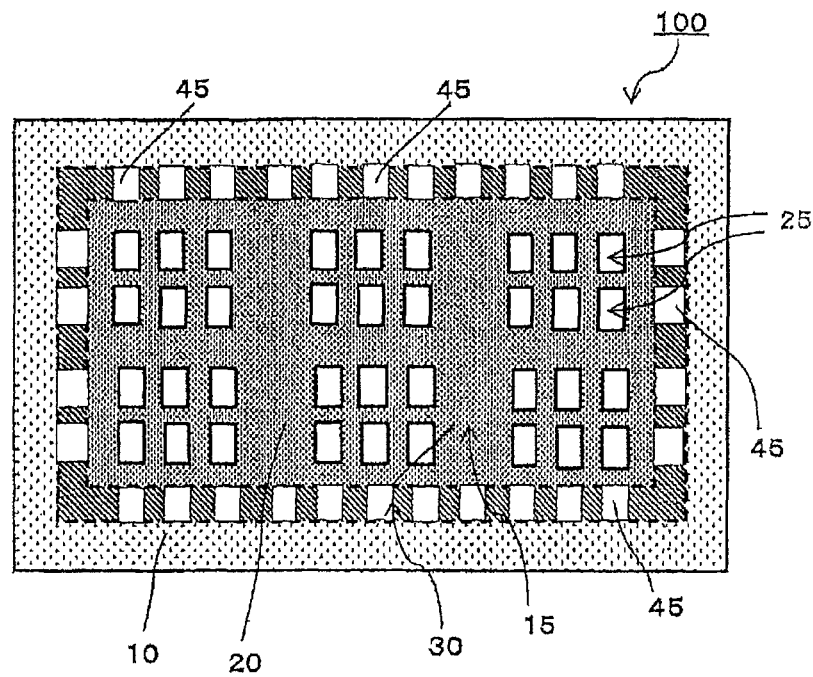
FIGS. 19(a)-(b) elevation views exemplarily showing a vapor deposition mask according to an embodiment of the present disclosure as seen from the metal mask side in plan view.
Figure 19:
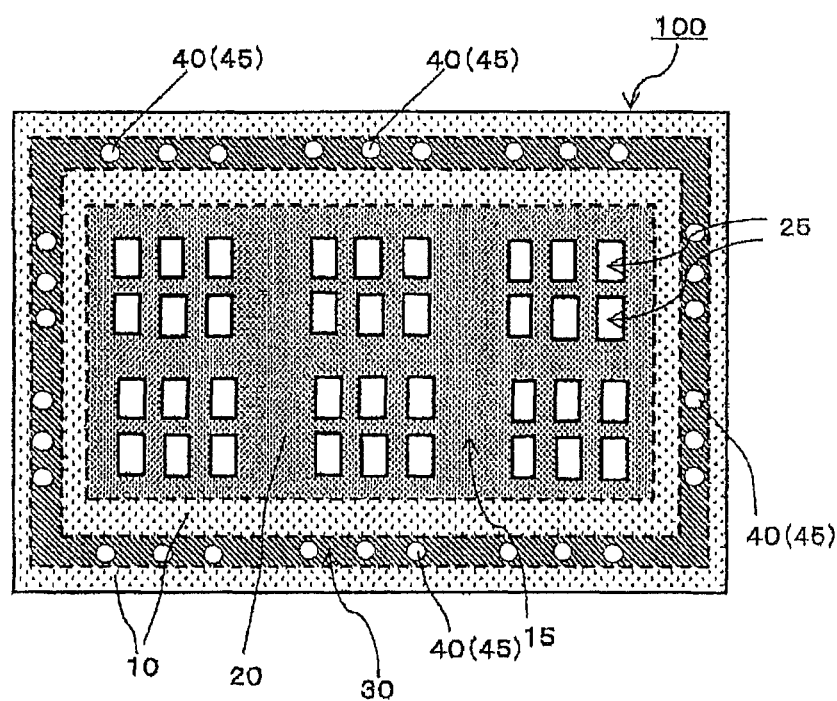

In the vapor deposition mask 100 in the modes shown in FIGS. 19(a) and 19(b), the metal mask 10 only includes one metal mask opening 15, and the arrangement region 30 is positioned so as to enclose the one metal mask opening 15. Notably, in the mode shown in FIG. 19(a), the outer edge of the metal mask opening 15 overlaps with the outer edge of the arrangement region 30, and in the mode shown in FIG. 19(b), the outer edge of the arrangement region 30 is positioned to be spaced at a predetermined distance from the outer edge of the metal mask opening 15. Notably, since fixation of a vapor deposition mask to a frame is typically performed at the outer circumference of the vapor deposition mask, with this point taken into consideration, the outer edge of the metal mask 10 is preferable not to overlap with the outer edge of the arrangement region 30. In other words, the recess part 45 is preferable not to be positioned in a portion overlapping with the outer edge of the metal mask. While in the mode shown in FIG. 19, a plurality of rigidity adjustment parts 36 are arranged in the arrangement region 30, the whole arrangement region 30 may be set to be the recess part 45 in the mode shown in FIG. 19(a), and the whole arrangement region 30 may be set to be the through hole 40 or the recess part 45 in the mode shown in FIG. 19(b). In other words, the whole arrangement region may be set to be the rigidity adjustment part 36, in other words, one continuous through hole 40 or recess part 45 may enclose one metal mask opening 15 (refer to FIGS. 11(a) and 11(c)). Moreover, in place of the mode shown in the figure, the rigidity adjustment parts 36 may be arranged only in a part of the arrangement region 30 for example, only close to the corners of the metal mask (not shown).

<<Vapor Deposition Mask Preparation Body>>

Next, a vapor deposition mask preparation body is described. The vapor deposition mask preparation body is prepared for producing the vapor deposition mask 100 described above, and so to speak, is a semifinished product. Specifically, it is a vapor deposition mask preparation body for producing a vapor deposition mask 100 including: a resin mask 20 including a plurality of resin mask openings 25 corresponding to a pattern to be produced by vapor deposition; and a metal mask 10 including a metal mask opening 15, the resin mask and the metal mask being stacked such that the resin mask openings 25 overlap with the metal mask opening 15, the vapor deposition mask preparation body being constituted of the metal mask 10 and a resin plate provided on one surface of the metal mask, wherein a shape of the metal mask opening 15 as the metal mask 10 is seen in plan view is a shape a basic shape of which is a polygon and which is obtained by adding an elongation part 35 for elongating a length of a whole periphery of the polygon. By using the vapor deposition mask preparation body as above, a vapor deposition mask with high density and high definition can be simply produced with excellent precision, for example, by forming resin mask openings with a desired shape in a resin plate with laser through the metal mask opening from the metal mask side of the vapor deposition mask preparation body.

Notably, also in the aforementioned vapor deposition mask preparation body, in the metal mask 10 constituting this, the rigidity adjustment part 36 described above may be provided.

<<Method for Producing Vapor Deposition Mask>>

A method for producing a vapor deposition mask 100 according to an embodiment of the present disclosure described above is not specially limited but various methods can be properly employed. For example, the vapor deposition mask 100 may be prepared by separately producing the metal mask 10 and the resin mask 20, and after that, pasting both masks together with an adhesive agent or the like. Meanwhile, the vapor deposition mask 100 may be prepared by preparing a stacked body having a metal plate and a resin plate stacked, producing the aforementioned vapor deposition mask preparation body by forming the metal mask opening 15 in the metal plate constituting the stacked body to make the metal mask 10, and next, forming the resin mask openings 25 in the resin plate constituting the vapor deposition mask preparation body to make the resin mask 20.

Notably, a method for producing the metal mask 10, in other words, a method for forming the metal mask opening 15, the elongation part 35 and the rigidity adjustment part 36 is not specially limited but, for example, the metal mask 10 may be produced by depositing metal on a desired region by various PVD methods such as a vacuum vapor deposition method, a sputtering method and an ion plating method, a CVD method, a plating method, and the like. Meanwhile, the metal mask 10 including desired opening region and recess part may be produced by processing the metal plate by etching processing, excavating processing, and laser processing, and the like.

Moreover, a method for producing the resin mask 20, in other words, a method for forming the resin mask openings 25 is not specially limited but the resin mask 20 including a desired opening region may be produced by processing the resin plate by etching processing, excavating processing, and laser processing, and the like.

<<Method for Producing Organic Semiconductor Element>>

Next, a method for producing an organic semiconductor element according to an embodiment of the present disclosure (hereinafter referred to as the method for producing an organic semiconductor element of the present disclosure) is described. The method for producing an organic semiconductor element of the present disclosure is characterized in that it includes a step of forming a vapor deposition pattern on a vapor deposition target using a vapor deposition mask, wherein in the step of forming the vapor deposition pattern, the vapor deposition mask of the present disclosure described above is used.

Steps of forming a vapor deposition pattern by a vapor deposition method using the vapor deposition mask are not specially limited but include an electrode forming step, an organic layer forming step, a counter electrode forming step, a sealing layer forming step and the like in which electrodes are formed on a substrate, and in any of the steps, the vapor deposition pattern is formed using the vapor deposition pattern forming method of the present disclosure described above. For example, in the case where the step of forming a vapor deposition pattern of the present disclosure described above is applied to each of light-emitting layer forming steps for colors of R (red), G (green) and B (blue) in an organic EL device, vapor deposition patterns are formed for light-emitting layers for the colors on the substrate. Notably, the method for producing an organic semiconductor element of the present disclosure is not limited to be applied to these steps, but to any steps in conventionally known production of an organic semiconductor element.

According to the method for producing an organic semiconductor element of the present disclosure described above, vapor deposition for forming an organic semiconductor element can be performed in the state where the vapor deposition mask is brought into close contact with a vapor deposition target without a gap, and an organic semiconductor element with high definition can be produced. As organic semiconductor elements produced by the method for producing an organic semiconductor element of the present disclosure, for example, organic layers, light-emitting layers, cathode electrodes and the like of organic EL elements can be cited. In particular, the method for producing an organic semiconductor element of the present disclosure can be preferably used for production of R (red), G (green) and B (blue) light-emitting layers of organic EL elements which require pattern precision with high definition.

<<Method for Producing Organic EL Display>>

Next, a method for producing an organic EL display (organic electroluminescence display) according to an embodiment of the present disclosure (hereinafter referred to as method for producing an organic EL display according to the present disclosure) is described. In the method for producing an organic EL display according to the present disclosure, the organic semiconductor element produced by the method for producing an organic semiconductor element according to the present disclosure described above is used in a step of producing the organic EL display.

Figure 22:
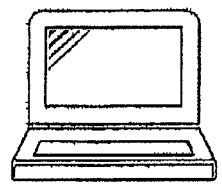
FIGS. 22(a)-(g) show diagrams showing examples of devices using organic EL displays.
Figure 22:
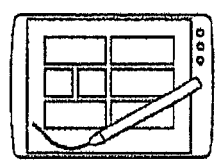
Figure 22:
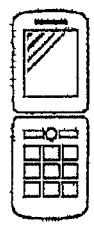
Figure 22:
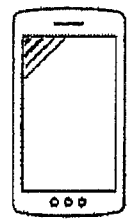
Figure 22:
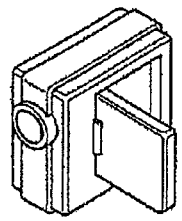
Figure 22:
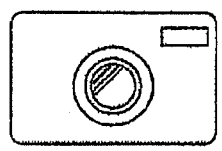
Figure 22:
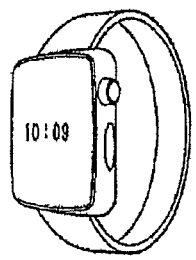

As the organic EL displays in which the organic semiconductor elements produced by the aforementioned method for producing an organic semiconductor element according to the present disclosure are used, for example, organic EL displays used for a notebook-sized personal computer (refer to FIG. 22(*a*)), a tablet terminal (refer to FIG. 22(*b*)), a mobile phone (refer to FIG. 22(*c*)), a smartphone (refer to FIG. 22(*d*)), a video camera (refer to FIG. 22(*e*)), a digital camera (refer to FIG. 22(*f*)), a smartwatch (refer to FIG. 22(*g*)) and the like can be cited.

REFERENCE SIGNS LIST

10 Metal mask
15 Metal mask opening
20 Resin mask
25 Resin mask opening
35 Elongation part
36 Rigidity adjustment part 40 Through hole
45 Recess part
100 Vapor deposition mask

The invention claimed is:

1. A vapor deposition mask comprising:
a resin mask including a plurality of resin mask openings corresponding to a pattern to be produced by vapor deposition; and a metal mask including a metal mask opening, the resin mask and the metal mask being stacked such that the resin mask openings overlap with the metal mask opening, wherein
a shape of the metal mask opening as the metal mask is seen in plan view includes a polygon as a basic shape and an elongation part, added to the polygon, the elongation part elongating a length of a whole periphery of the polygon.

2. The vapor deposition mask according to claim 1, wherein the metal mask includes one or a plurality of rigidity adjustment parts that partially reduce rigidity of the metal mask at a position not overlapping with the resin mask openings of the resin mask.

3. The vapor deposition mask according to claim 2, wherein the rigidity adjustment part is a through hole penetrating the metal mask or a recess part provided in the metal mask.

4. A method for producing an organic semiconductor element, comprising
a vapor deposition pattern forming step of forming a vapor deposition pattern on a vapor deposition target using a vapor deposition mask, wherein
the vapor deposition mask used in the vapor deposition pattern forming step is the vapor deposition mask according to claim 1.

5. A method for producing an organic EL display, wherein an organic semiconductor element produced by the method for producing an organic semiconductor element according to claim 4 is used.

* * * * *